United States Patent
Tanaka et al.

(10) Patent No.: US 6,341,646 B1
(45) Date of Patent: Jan. 29, 2002

(54) COOLING DEVICE BOILING AND CONDENSING REFRIGERANT

(75) Inventors: Hiroshi Tanaka; Tadayoshi Terao, both of Toyoake; Kiyoshi Kawaguchi, Toyota; Takahide Ohara, Okazaki; Akihiro Maeda, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/443,738

(22) Filed: Nov. 19, 1999

(30) Foreign Application Priority Data

Nov. 20, 1998 (JP) .......... 10-330986
Nov. 20, 1998 (JP) .......... 10-331619

(51) Int. Cl.$^7$ ............................ F28D 15/00
(52) U.S. Cl. .................. 165/104.33; 165/104.21; 361/700; 257/715
(58) Field of Search ............... 165/104.21, 104.33, 165/80.3; 361/700; 257/715, 714

(56) References Cited

U.S. PATENT DOCUMENTS 5,998,863 A * 12/1999 Kobayashi et al. .... 165/104.33
6,076,596 A * 6/2000 Osakabe et al. ....... 165/104.21

FOREIGN PATENT DOCUMENTS

JP    A-9-205167    8/1997
SU    0218917    * 5/1968 ............ 165/104.33

* cited by examiner

*Primary Examiner*—Christopher Atkinson
(74) *Attorney, Agent, or Firm*—Harness, Dickey & Pierce, PLC

(57) ABSTRACT

A cooling device boiling and condensing refrigerant includes a refrigerant tank having a boiling space in which a part of liquid refrigerant is boiled and vaporized to gas refrigerant by absorbing heat from a heat-generating member, first and second radiators disposed at upper and lower parts of the refrigerant tank, defined by a liquid refrigerant surface within the refrigerant tank, and a connection pipe connecting the first and second radiators. The first and second radiators have the same shape, and are disposed to cool and condense gas refrigerant from the boiling space. In the cooling device, even when the cooling device is used in a normal state or a vertically reversed state, sufficient radiating performance of the first and second radiators can be obtained.

16 Claims, 22 Drawing Sheets

COOLING DEVICE BOILING AND CONDENSING REFRIGERANT

CROSS-REFERENCE TO RELATED APPLICATION

This application is related to and claims priority from Japanese Patent Applications No. Hei. 10-330986 filed on Nov. 20, 1998, and No. Hei. 10-331619 filed on Nov. 20, 1998, the contents of which are hereby incorporated by reference.

BACKGROUND OF THE INVENTION

1. Field of the Invention

The present invention relates to a cooling device for cooling a heat-generating member by boiling and condensing refrigerant.

2. Description of Related Art

In a conventional cooling device described in JP-A-9-205167, refrigerant in a refrigerant tank is boiled by heat from a heat-generating member, and gas refrigerant from the refrigerant tank is condensed in a radiator. Further, a liquid-refrigerant returning passage is provided in a straight line within the refrigerant tank so that condensed liquid refrigerant from the radiator is prevented from interfering with gas refrigerant boiled in the refrigerant tank by heat from the heat-generating member. However, when the cooling device is used for cooling a computer chip and has a small size, it is difficult to form the liquid-refrigerant returning passage into a straight line around a boiling space of the refrigerant tank, because an attachment hole for attaching the heat-generating member such as the computer chip is necessary to be provided in the refrigerant tank around the boiling space. Further, for stably circulating refrigerant between the refrigerant tank and the radiator, the liquid-refrigerant returning passage is necessary to have a flow resistance larger than that in a gas-refrigerant passage from the refrigerant tank to the radiator.

On the other hand, in the conventional cooling device, the arrangement positions of the refrigerant tank and the radiator are restricted in a vertical direction so that necessary radiating performance is obtained. Therefore, it is impossible for the cooling device to be vertically reversely used.

SUMMARY OF THE INVENTION

In view of the foregoing problems, it is an object of the present invention to provide a cooling device boiling and condensing refrigerant, which has a sufficient cooling performance even when being vertically reversely used.

It is an another object of the present invention to provide a cooling device boiling and condensing refrigerant, in which a liquid-refrigerant returning passage is provided in a refrigerant tank to have a resistance portion generating a flow resistance.

It is a further another object of the present invention to provide a cooling device boiling and condensing refrigerant, in which a liquid-refrigerant returning passage is provided without interfering with an attachment structure of a heat-generating member.

According to a first aspect of the present invention, a cooling device includes a refrigerant tank having a boiling space in which a part of liquid refrigerant is boiled and vaporized to gas refrigerant by absorbing heat from a heat-generating member, and first and second radiators for cooling and condensing gas refrigerant from the boiling space by performing heat exchange with outside fluid passing through the first and second radiators. The boiling space of the refrigerant tank has first and second space parts defined by a surface of the liquid refrigerant, the first radiator is connected to the refrigerant tank to communicate with the first space part of the boiling space, and the second radiator is connected to the refrigerant tank to communicate with the second space part of the boiling space. Thus, any one of the first and second radiators always communicates with a gas-refrigerant space upper than the liquid refrigerant surface within the refrigerant tank, and the other one thereof always communicates with a liquid refrigerant space lower than the liquid refrigerant surface. As a result, even when the cooling device is used in a vertically reversed state, sufficient radiating performance of the cooling device can be proposed.

Preferably, the first radiator and the second radiator communicate with each other through a communication passage. Therefore, refrigerant having been cooled and condensed in any one of the first and second radiators, disposed at an upper side, is further cooled and condensed in the other one of the first and second radiators. Thus, radiating performance of the cooling device is further improved while the size of the cooling device is reduced.

Preferably, the first and second radiators are disposed in such a manner that any one of the first and second radiators positioned at an upper side in the vertical direction is inclined relative to a horizontal direction to be readily introduce liquid refrigerant into the communication passage, during a normal state and a reversed state. Therefore, it prevents refrigerant from staying in the radiator positioned at the upper side, and refrigerant-circulating performance of the cooling device is improved.

According to a second aspect of the present invention, a cooling device includes a refrigerant tank having a boiling space in which a part of liquid refrigerant is boiled and vaporized to gas refrigerant by absorbing heat from the heat-generating member, a radiator for cooling gas refrigerant from the refrigerant tank. The radiator has a first header into which gas refrigerant from the boiling space flows, a plurality of tubes in which gas refrigerant from the first header is cooled and condensed by performing heat exchange with outside fluid passing through the radiator, and a second header through which liquid refrigerant condensed in the tubes returns to the refrigerant tank. The refrigerant tank has a gas refrigerant outlet for introducing gas refrigerant from the boiling space into the first header, and a liquid-refrigerant returning passage through which liquid refrigerant from the second header of the radiator is introduced into a bottom side of the boiling space. In the cooling device, the liquid-refrigerant returning passage is provided at a side of the boiling space, and has a resistance portion at which a flow resistant of liquid refrigerant flowing through the liquid-refrigerant returning passage is increased. Thus, gas refrigerant preferentially flows through the gas refrigerant outlet as compared with the condensed liquid refrigerant flowing through the liquid-refrigerant returning passage. As the resistance portion, a bent portion or a throttle is provided in the liquid-refrigerant returning passage.

When the bent portion is provided in the liquid-refrigerant returning passage, an attachment structure for attaching a heat-generating member onto the refrigerant tank can be provided in a space obtained due to the bent portion. Therefore, the liquid-refrigerant returning passage is provided without interfering with the attachment structure of the heat-generating member.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention will be described hereinafter with reference to the accompanying drawings.

Figure 1:
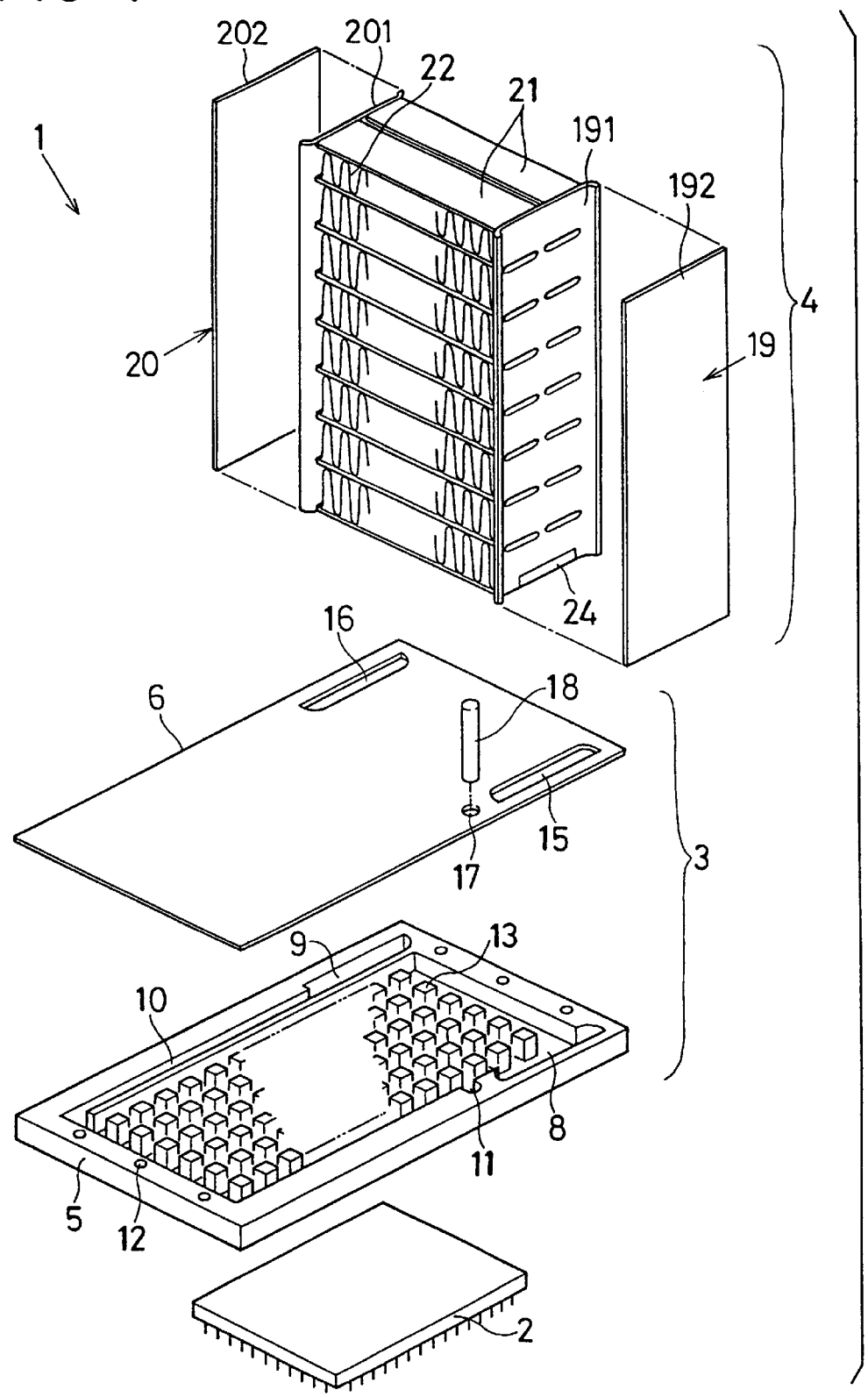
FIG. 1 is a disassemble perspective view showing a cooling device according to a first preferred embodiment of the present invention.

A first preferred embodiment of the present invention and modifications thereof will be now described with reference to FIGS. 1–8. In the present invention, a cooling device 1 is typically used for cooling a heat-generating member 2 such as a computer chip disposed in a printed base plate, for example. As shown in FIG. 1, the cooling device 1 includes a refrigerant tank 3 in which liquid refrigerant (e.g., water, alcohol, fluorocarbon or flon) is stored, and a radiator 4 in which gas refrigerant boiled in the refrigerant tank 3 by heat generated from the heat-generating member 2 is heat-exchanged with outside fluid (e.g., cool air) to be liquefied. The refrigerant tank 3 and the radiator 4 are integrally bonded through brazing.

Figure 2:
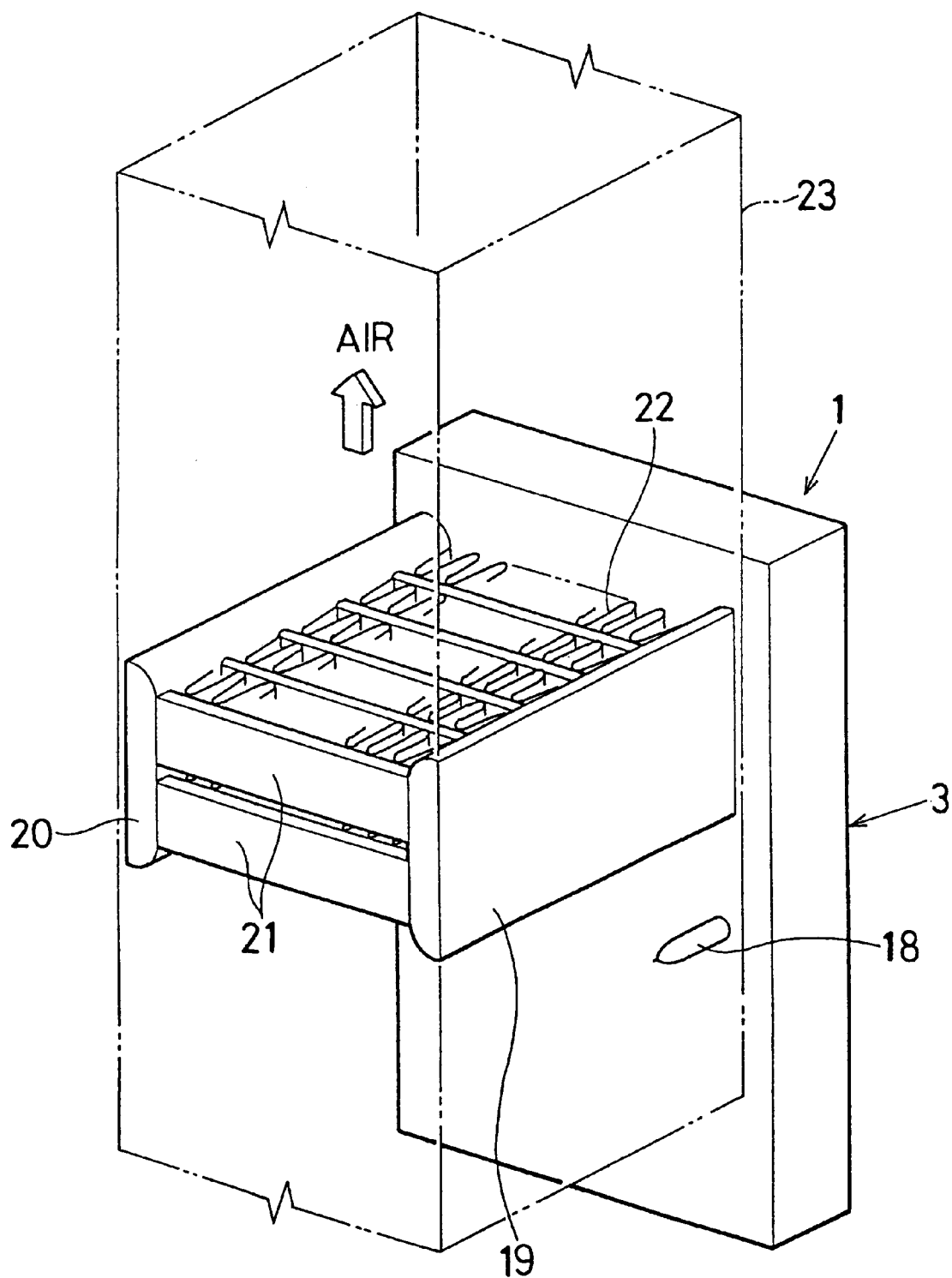
FIG. 2 is a perspective view showing the cooling device according to the first embodiment.
Figure 3:
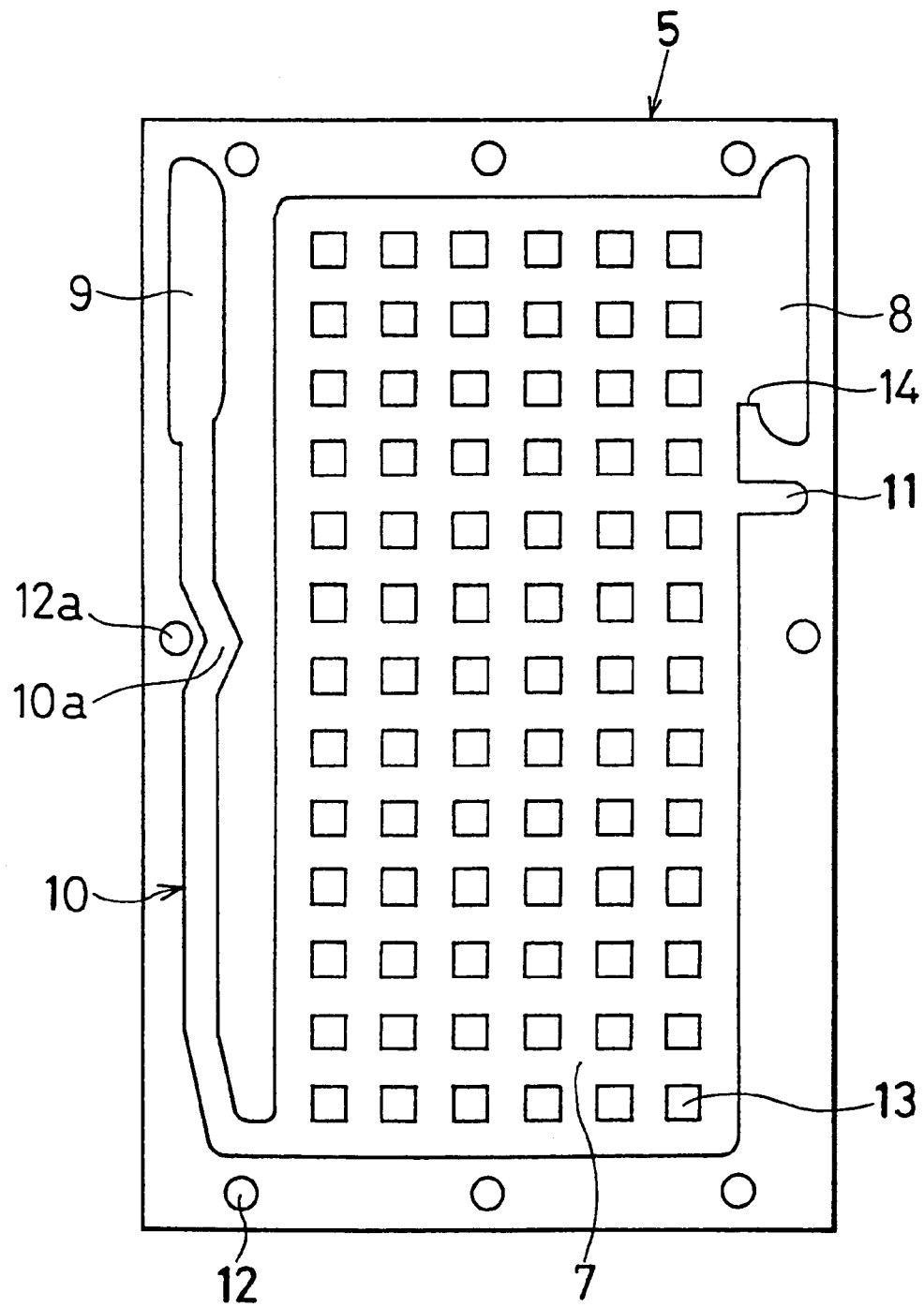
FIG. 3 is a plan view of a thin receiver of a refrigerant tank according to the first embodiment.

The refrigerant tank 3 includes a thin receiver 5 and a cover plate 6 made of metal such as aluminum having a sufficient heat-transmitting performance, and is used in a vertical state as shown in FIG. 2. As shown in FIG. 3, the thin receiver 5 is formed into a rectangular flat shape having a larger vertical dimension. The thin receiver 5 has a flat surface on a back side in FIG. 3, to which the heat-generating member 2 is attached. On a face side of the thin receiver in FIG. 3, a boiling space 7, a pair of header connection portions 8, 9, a liquid-refrigerant returning passage 10 and refrigerant inlet portion 11 are provided. Further, as shown in FIG. 3, plural holes 12 penetrating through the thin receiver 5 in a face-back direction in FIG. 3 are formed in an outer peripheral part of the thin receiver 5.

The boiling space 7 is provided within an inside portion of the thin receiver 5, so that liquid refrigerant is boiled by heat from the heat-generating member 2. Plural prismatic portions 13 are regularly arranged in the boiling space 7 to have a predetermined distance between adjacent prismatic portions 13. Therefore, a refrigerant passage is defined in the boiling space 7 by the plural prismatic portions 13. The plural prismatic portions 13 disposed in the boiling space 7 are also used for enhancing the strength of the refrigerant tank 3.

The header connection portions 8, 9 are connected to first and second headers 19, 20 of the radiator 4. Therefore, the header connection portions 8, 9 have spaces corresponding to sectional shapes of the first and second headers 19, 20, respectively. Specifically, the header connection portion 8 provided adjacent to the boiling space 7 at an upper right side in FIG. 3 to communicate with the boiling space 7 through a gas refrigerant outlet 14. On the other hand, the header connection portion 9 is provided at an upper left side of the boiling space 7 in FIG. 3 to communicate with the boiling space 7 through the liquid-refrigerant returning passage 10.

The liquid-refrigerant returning passage 10 for returning condensed liquid refrigerant liquefied in the radiator 4 to the boiling space 7 is provided to extend from a lower part of the header connection portion 9 downwardly until a bottom side of the boiling space 7. The liquid-refrigerant returning passage 10 has a bent portion 10a for increasing flow resistance (pressure loss). That is, the bent portion 10a of the liquid-refrigerant returning passage 10 is used as a resistance portion for increasing the flow resistant of liquid refrigerant.

The refrigerant inlet portion 11 for pouring refrigerant into the boiling space 7 of the refrigerant tank 3 is provided in the refrigerant tank 3 on a lower side of the header connection portion 8, for example. The boiling space 7, the header connection portions 8, 9, the liquid-refrigerant returning passage 10 and the refrigerant inlet portion 11 are formed in the refrigerant tank 3 by cutting, electrical discharging machining, forging and casting, for example.

The holes 12 are provided for fixing the heat-generating member 2 onto the flat surface of the thin receiver 5 by a fastening member. A hole 12a among the holes 12 is provided in the peripheral portion of the refrigerant tank 10 outside the liquid-refrigerant returning passage 10. In the first embodiment, the hole 12a is provided in a space enlarged due to the bent portion 10a of the liquid-refrigerant returning passage 10. That is, the bent portion 10a of the liquid-refrigerant returning passage 10 is bent apart from the hole 12a.

The cover plate 6 of the refrigerant tank 3 is connected to an opened surface of the thin receiver 5, opposite to the flat surface, so that the boiling space 7 and the liquid-refrigerant returning passage 10 are air-tightly sealed within the refrigerant tank 3. Insertion ports 15, 16 from which the first and second headers 19, 20 of the radiator 4 are inserted into the header connection portions 8, 9 are opened in the cover plate 6 at both sides corresponding to the header connection portions 8, 9. Therefore, the insertion ports 15, 16 respectively communicate with the header connection portions 8, 9. Further, the cover plate 6 has a round hole 17 communicating with the refrigerant inlet portion 11 provided in the thin receiver 5. The round hole 17 is connected to an inlet pipe 18 through which refrigerant is poured and introduced into the refrigerant tank 3. The round hole 17 is provided around an extending line of the header connection portion 8 in a vertical direction in FIG. 2. After refrigerant is poured into the refrigerant tank 3 by a predetermined amount, a top end of the inlet pipe 18 is closed. The cover plate 6 can be formed by a clad material on which a brazing material is applied.

The radiator 4 includes the first header 19 on a gas refrigerant side, the second header 20 on a liquid refrigerant side, and a core portion between the first and second headers 19, 20. As shown in FIG. 2, cool air is blown toward the radiator 4 through a duct 23. The duct 23 is disposed to enclose the first and second headers 19, 20 of the radiator 4. Further, the duct 23 is disposed along outer wall surfaces of the first and second headers 19, 20 to have a little clearance between the outer wall surfaces 19, 20 (i.e., first and second outer header plates 192, 202) and the duct 23 or to contact the outer wall surfaces of the first and second headers 19, 20. As shown in FIG. 2, cool air (outside fluid) passes through the core portion of the radiator 4 upwardly from below.

Gas refrigerant boiled by heat from the heat-generating member 2 in the refrigerant tank 3 flows into the first header 19, and passes through the core portion to be liquefied. Liquid refrigerant condensed in the core portion of the radiator 4 flows into the second header 20, and is introduced into the refrigerant tank 3 through the liquid-refrigerant returning passage 10. As shown in FIG. 1, the first header 19 is formed by a first inner header plate 191 on a side of the core portion and a first outer header plate 192 on an outer wall side. Similarly, the second header 20 is formed by a second inner header plate 201 on a side of the core portion and a second outer header plate 202 on an outer wall side.

One side end of the first header 19 in a longitudinal direction of the first header 19 is inserted into the insertion port 15 of the cover plate 6 and is further inserted into the header connection portion 8 within the thin receiver 5. The first header 19 of the radiator 4 is connected to the refrigerant tank 3 to be approximately perpendicular to the cover plate 6. As shown in FIG. 1, a communication port 24 communicating with the gas refrigerant outlet 14 of the refrigerant tank 3 is formed in the first inner header plate 191 of the first header 19 at the inserted part. In the first embodiment, the communication port 24 has a size similar to the gas refrigerant outlet 14, and a shape corresponding to the gas refrigerant outlet 14. Further, in the first inner header plate 191 of the first header 19, plural tube insertion elongated holes into which one side ends of radiator tubes 21 are inserted are formed to be arranged in upper and lower two lines to have a predetermined distance between adjacent elongated holes in each line.

On the other hand, one top end of the second header 20 in the longitudinal direction is inserted into the header connection portion 9 of the thin receiver 5 through the insertion port 16 of the cover plate 6. The second header 20 of the radiator 4 is connected to the refrigerant tank 3 approximately perpendicular to the cover plate 6. Further, the second header 20 is disposed in parallel with the first header 19. The second header 20 has a communication port communicating with the liquid-refrigerant returning passage 10 on the inserted end side. In the second inner header plate 201 of the second header 20, plural tube insertion elongated holes into which other side ends of the radiator tubes 21 are inserted are formed to be arranged in two lines to have a predetermined distance between adjacent elongated holes in each line.

The core portion is a heat-radiating portion in which heat of gas refrigerant boiled by heat from the heat-generating member 2 is transmitted to the cool air. The core portion includes the plural radiator tubes 21 and plural radiator fins 22 each of which is disposed between adjacent radiator tunes 21. Each radiator tube 21 is formed into a flat like in a laminating direction of the radiator tubes 21 and the radiator fins 22. The radiator tubes 21 are arranged in upper and lower two lines between the first header 19 and the second header 20. The radiator tubes 21 in each line are laminated and connected through the radiator fins 22. One side ends of the radiator tubes 21 are inserted into the elongated holes which are provided in the first inner header plate 191 of the first header 19 in two lines. The other side ends of the radiator tubes 21 are inserted into the elongated holes which are provided in the second inner header plate 201 of the second header 20 in two lines. Thus, the first header 19 and the second header 20 communicate with each other through the radiator tubes 21. Each radiator fin 22 is formed by bending a thin metal plate having a sufficient heat transmitting performance, such as an aluminum plate, into a wave shape. Each radiator fin 22 is connected to outer wall surfaces of the radiator tubes 21 adjacent to each other.

Next, operation of the cooling device 1 according to the first embodiment will be described.

Figure 4:
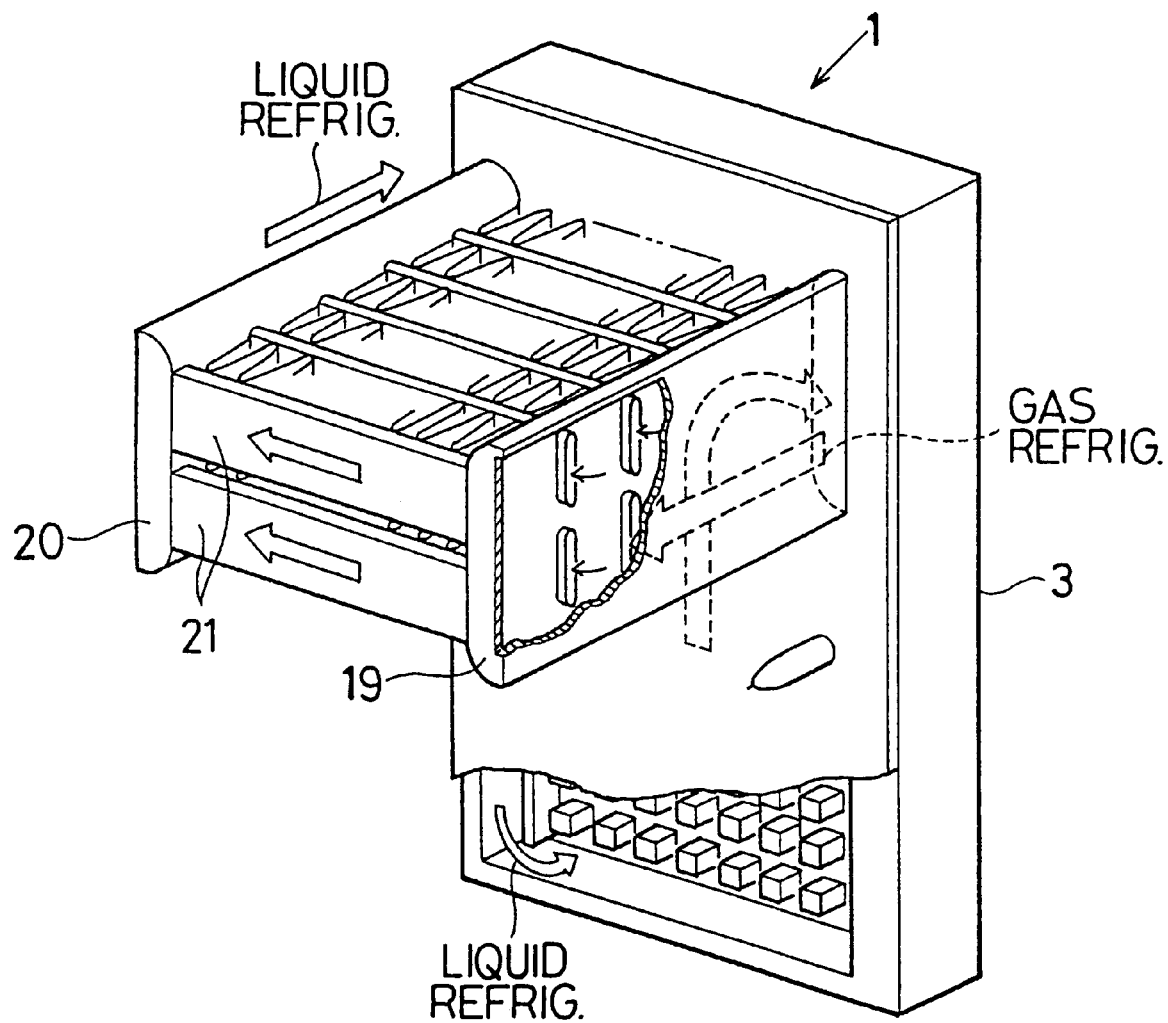
FIG. 4 is a perspective view of the cooling device, for explaining a refrigerant flow within the cooling device, according to the first embodiment.

A part of liquid refrigerant in the refrigerant tank 3 is boiled and evaporated by heat from the heat-generating member 2 in the boiling space 7, and the boiled refrigerant vapor (i.e., gas refrigerant) flows into the first header 19 from the boiling space 7 through the gas refrigerant outlet 14. Thereafter, gas refrigerant flows into each radiator tubes 21 from the first header 19. Gas refrigerant flowing through the radiator tubes 21 is cooled and condensed by cool air blown toward the core portion of the radiator 4 through the duct 23. Condensed liquid refrigerant flows into the second header 20 by gas refrigerant pressure, falls into the liquid-refrigerant returning passage 10 from the second header 20, and is returned into the boiling space 7 within the refrigerant tank 3. The flow direction of refrigerant in the cooling device 1 is indicated in FIG. 4 by arrows.

According to the first embodiment of the present invention, the bent portion 10a is provided in the liquid-refrigerant returning passage 10 as a resistance portion for generating pressure loss. Therefore, it is compared with a liquid-refrigerant returning passage formed in a straight line, the flow resistance is increased so that pressure loss in the liquid-refrigerant returning passage 10 becomes larger.

Thus, gas refrigerant flows preferentially through the gas refrigerant outlet 14, while liquid refrigerant flows through the liquid-refrigerant returning passage 10. As a result, refrigerant-circulating performance of the cooling device is improved.

Further, because the bent portion 10a is provided in the liquid-refrigerant returning passage 10, it is possible to provide the hole 12a in the space obtained due to the bent portion 10a. Therefore, even if the cooling unit 1 is used as a small cooling unit for cooling the heat-generating member 2 such as a computer chip, the liquid-refrigerant returning passage 10 can be formed without interfering with the hole 12a.

Next, modifications of the first embodiment will be now described. The shape of the liquid-refrigerant returning passage 10 and the shape of the bent portion 10a in the liquid-refrigerant returning passage 10 can be changed variously.

Figure 5:
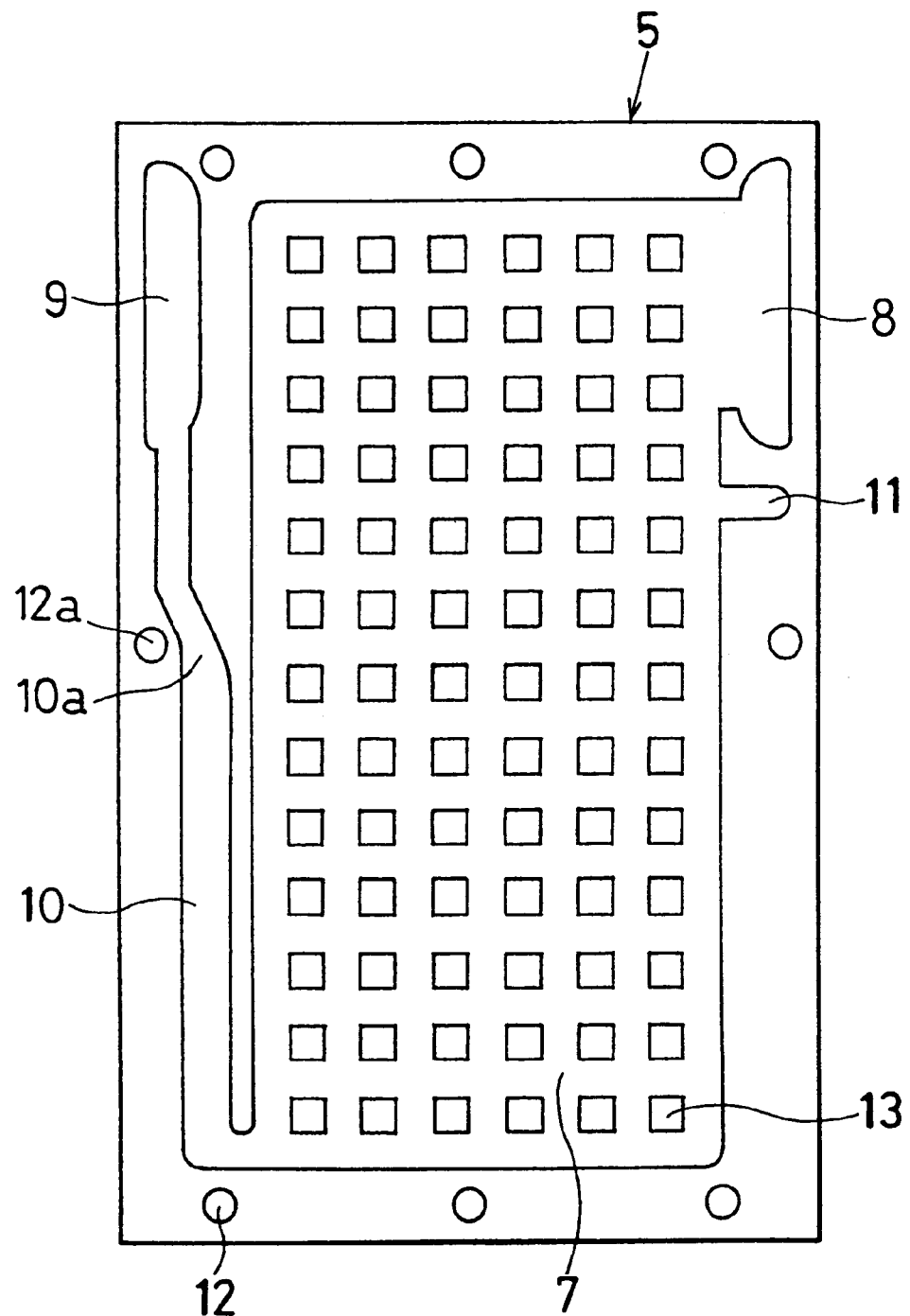
FIG. 5 is a plan view of a thin receiver of a refrigerant tank according to a modification of the first embodiment.

For example, the bent portion 10a of the liquid-refrigerant returning passage 10 can be changed as shown in FIG. 5. Even in this case, the same effect as described in the first embodiment can be proposed.

Figure 6:
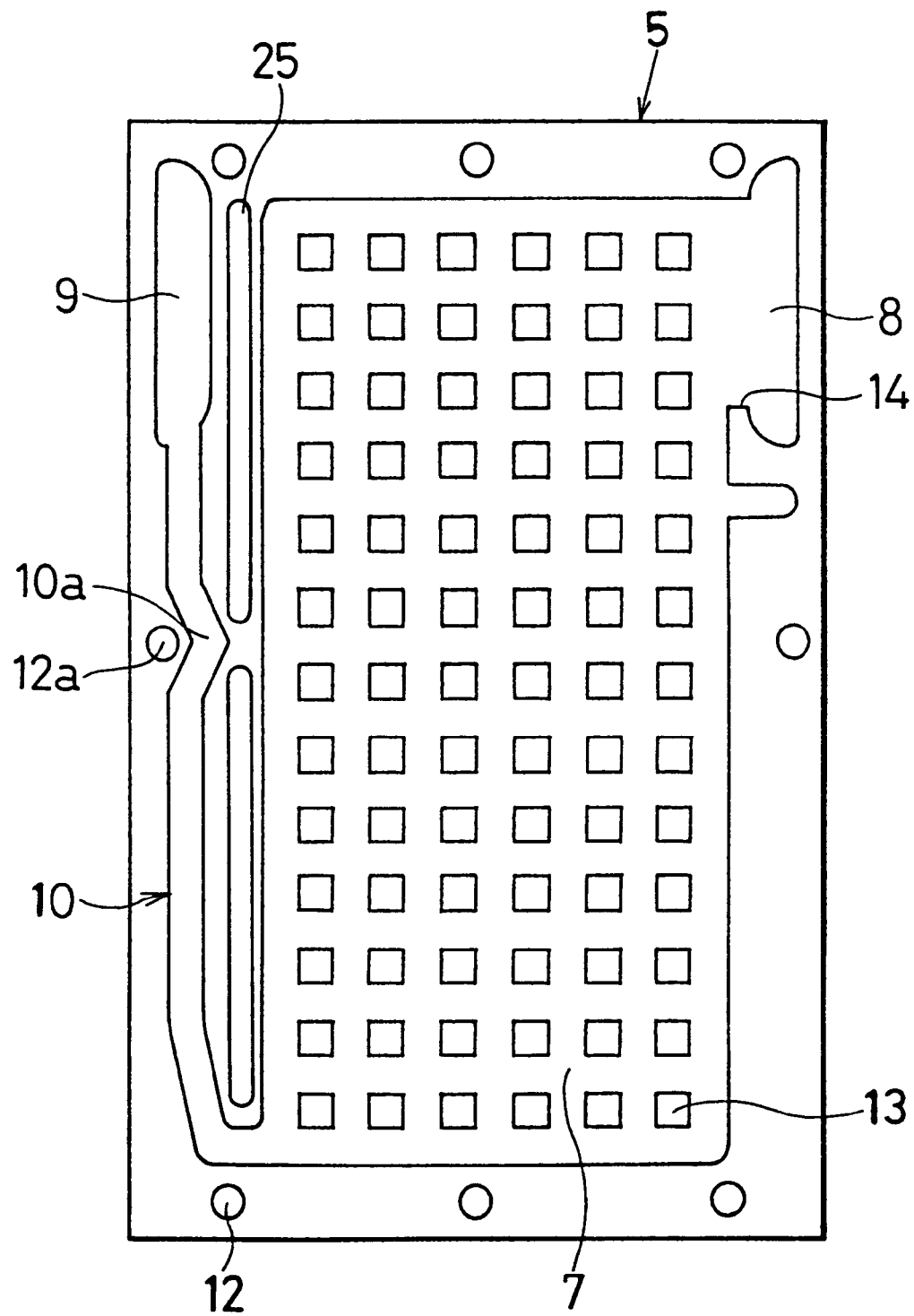
FIG. 6 is a plan view of a thin receiver of a refrigerant tank according to an another modification of the first embodiment.

Further, in a modification of the first embodiment shown in FIG. 6, a heat-insulating layer 25 is disposed in the refrigerant tank 3 between the liquid-refrigerant returning passage 10 and the boiling space 7. The heat-insulating layer 25 is formed into a passage like. When the refrigerant tank 3 has a small size, an area of the boiling space 7 is difficult to be sufficiently made larger relative to the size of the heat-generating member 2. In this case, the liquid-refrigerant returning passage 10 may be excessively close to a position where the heat-generating member 2 is attached to the refrigerant tank 3. Therefore, condensed liquid refrigerant flowing through the liquid-refrigerant returning passage 10 may be re-boiled by heat from the heat-generating member 2, and refrigerant may reversely flow through the liquid-refrigerant returning passage 10. In the present invention, as shown in FIG. 6, because the heat-insulating layer 25 is provided between the liquid-refrigerant returning passage 10 and the boiling space 7, it can prevent liquid refrigerant from being re-boiled in and reversely flowing through the liquid-refrigerant returning passage 10. The heat-insulating layer 25 may be made of a material having a small-heat transmitting performance to have sufficient heat-insulating effect. When the heat-insulating layer 25 is formed into a passage-like space, the passage-like space may communicate with outside air to be filled with air, or may be evacuated. Even in this case, as shown in FIG. 6, the bent portion 10a is provided in the liquid-refrigerant returning passage 10, and the hole 12a is provided in the space provided due to the bent portion 10a.

Figure 7:
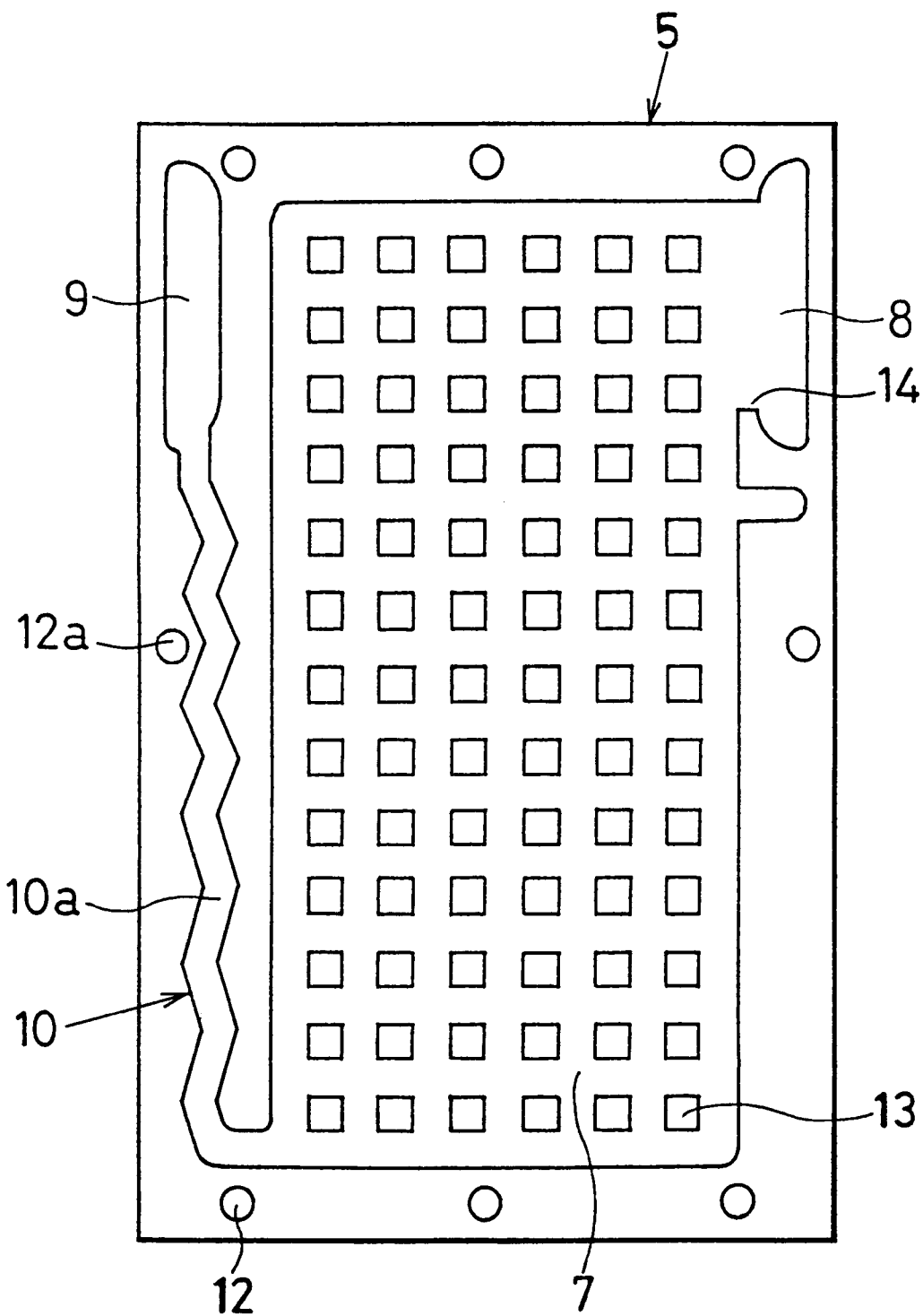
FIG. 7 is a plan view of a thin receiver of a refrigerant tank according to an another modification of the first embodiment.
Figure 8:
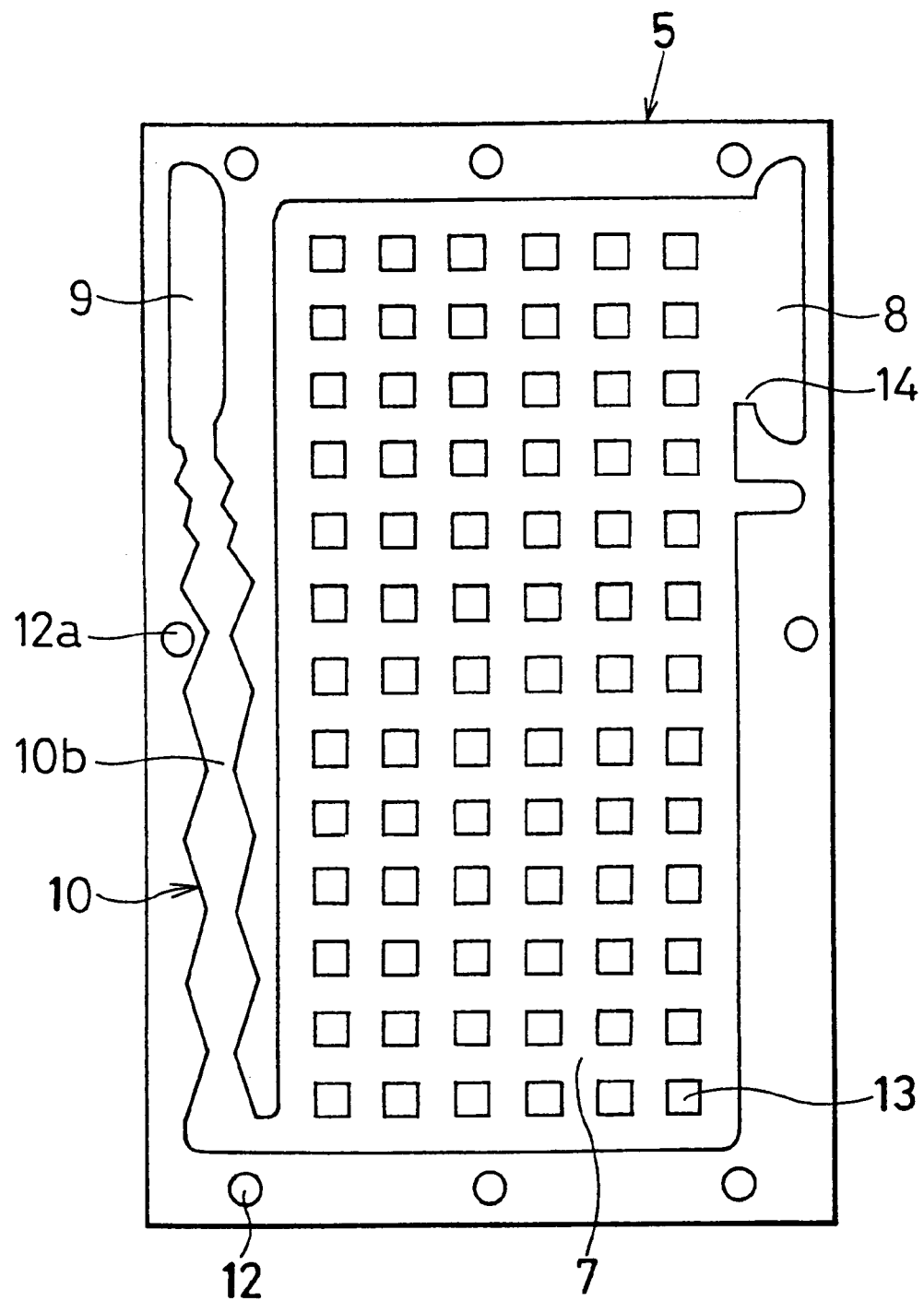
FIG. 8 is a plan view of a thin receiver of a refrigerant tank according to an another modification of the first embodiment.

In an another modification of the first embodiment of the present invention, as shown in FIG. 7, plural bent portions 10a are continuously formed as a resistance portion for generating pressure loss in the liquid-refrigerant returning passage 10. In this case, the pressure loss in the liquid-refrigerant returning passage 10 can be further increased.

Further, as the resistance portion for generating pressure loss in the liquid-refrigerant returning passage 10, plural throttles 10b having reduced sectional passage areas are continuously provided. Therefore, the pressure loss in the liquid-refrigerant returning passage 10 can be further increased as compared with a case where the single bent portion 10a is provided.

Figure 10A:
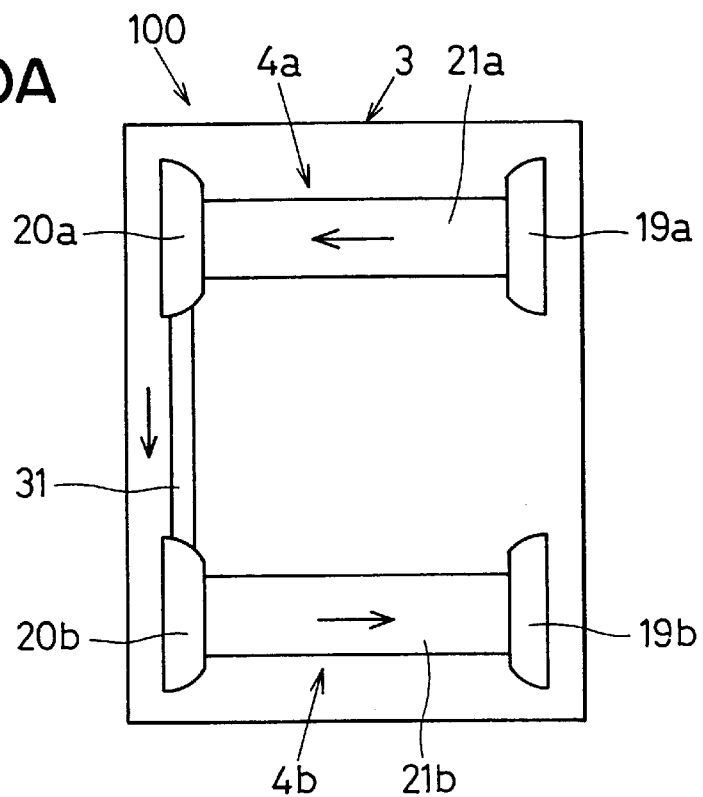
FIG. 10A is a schematic front view of the cooling device according to the second embodiment.
Figure 10B:
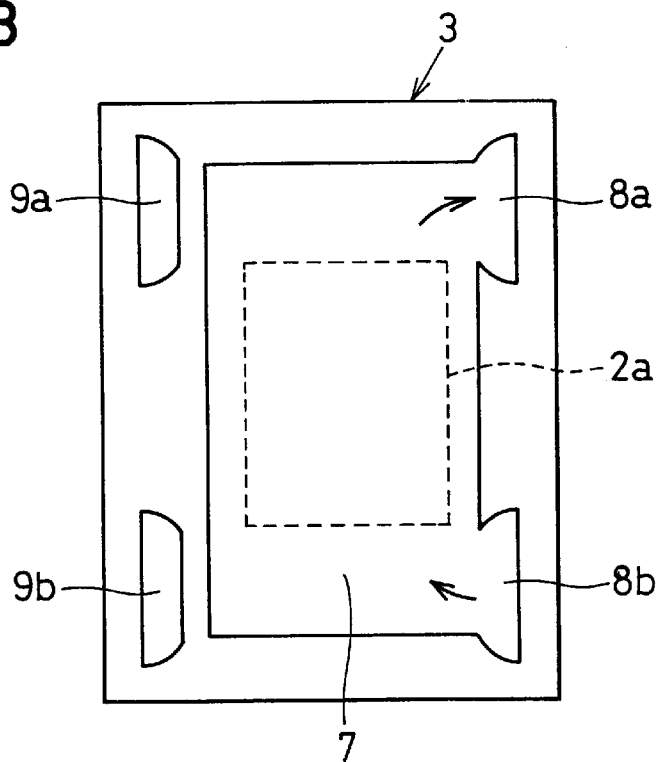
FIG. 10B is a plan view showing an inner structure of a refrigerant tank according to the second embodiment.
Figure 11:
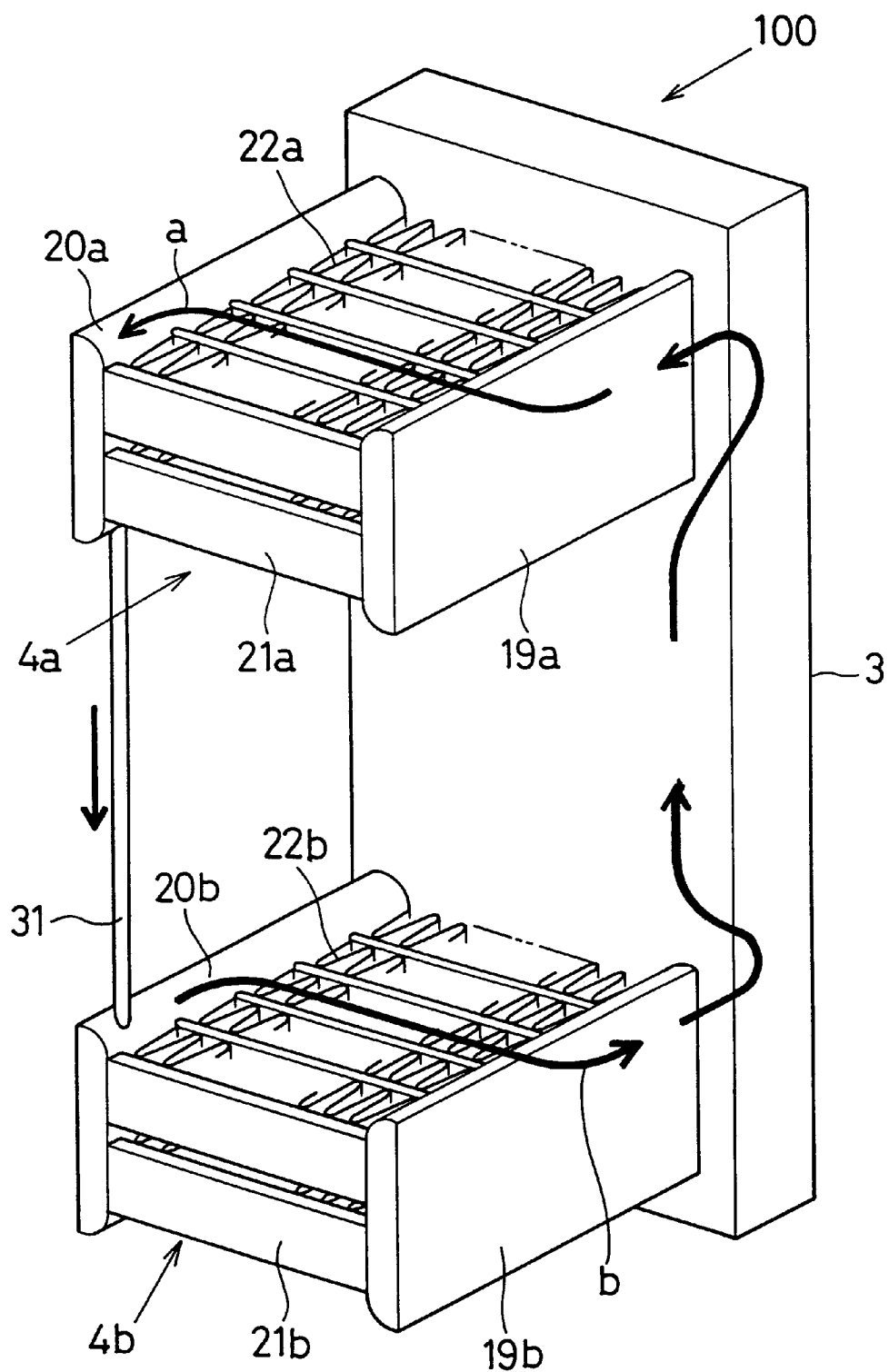
FIG. 11 is a perspective view of the cooling device showing a refrigerant flow, according to the second embodiment.

A second preferred embodiment of the present invention will now be described with reference to FIGS. 9–11. Similarly to the above-described first embodiment, in the second embodiment, a cooling device 100 is typically used for cooling a heat-generating member 2 such as a computer chip disposed in a printed base plate, for example. The cooling device 100 includes a refrigerant tank 3 in which liquid refrigerant (e.g., water, alcohol, fluorocarbon or flon) is stored, and first and second radiators 4a, 4b in which gas refrigerant boiled in the refrigerant tank 3 by heat generated from the heat-generating member 2 is heat-exchanged with outside fluid (e.g., cool air) to be liquefied. The refrigerant tank 3 and the radiators 4a, 4b are integrally bonded through brazing.

The refrigerant tank 3 is made of metal such as aluminum having a sufficient heat-transmitting performance, and is formed into a flat rectangular shape. As shown in FIG. 9, the refrigerant tank 3 is used in a vertical state, and the heat-generating member 2 is attached onto an attachment position 2a of a flat surface of the refrigerant tank 3 by a fastening unit such as a screw. As shown in FIG. 10B, the refrigerant tank 3 includes a boiling space 7 in which refrigerant is boiled by heat from the heat-generating member 2 attached onto the attachment position 2a of the flat surface of the refrigerant tank 3, first header connection portions 8a, 9a, and second header connection portions 8b, 9b. The boiling space 7 is provided at an all inner side of the refrigerant tank 3 so that heat from the heat-generating member 2 is readily transmitted to refrigerant within the refrigerant tank 3.

The first header connection portions 8a, 9a of the refrigerant tank 3 are respectively connected to first and second headers 19a, 20a of the first radiator 4a, and the second header connection portions 8b, 9b of the refrigerant tank 3 are respectively connected to first and second headers 19b, 20b of the second radiator 4b. Therefore, as shown in FIGS. 10A, 10B, the first header connection portions 8a, 9a of the radiator 3 have sectional shapes corresponding to those of the first and second headers 19a, 20a of the first radiator 4a, and the second header connection portions 8b, 9b of the radiator 3 have sectional shapes corresponding to those of the first and second headers 19b, 20b of the second radiator 4b. In the second embodiment, on a surface opposite to the flat surface where the heat-generating member 2 is attached, the first header connection portions 8a, 9a are provided at one side of the refrigerant tank 3 in a vertical direction, and the second header connection portions 8b, 9b are provided at the other side of the refrigerant tank 3 in the vertical direction.

Specifically, the first header connection portion 8a is provided at an upper right side of the boiling space 7 in FIG. 10B adjacent to the boiling space 7 to communicate with the boiling space 7, and the first header connection portion 9a is provided ar an upper left side of the boiling space 7 in FIG. 10B to be separated from the boiling space 7. On the other hand, the second header connection portion 8b is provided at a lower right side of the boiling space 7 in FIG. 10B adjacent to the boiling space 7 to communicate with the boiling space 7, and the second header connection portion 9b is provided at a lower left side of the boiling space 7 in FIG. 10B to be separated from the boiling space 7. Liquid refrigerant sealed in the refrigerant tank 3 has a liquid surface slightly lower than lower ends of the first header connection portions 8a, 9a.

Figure 9:
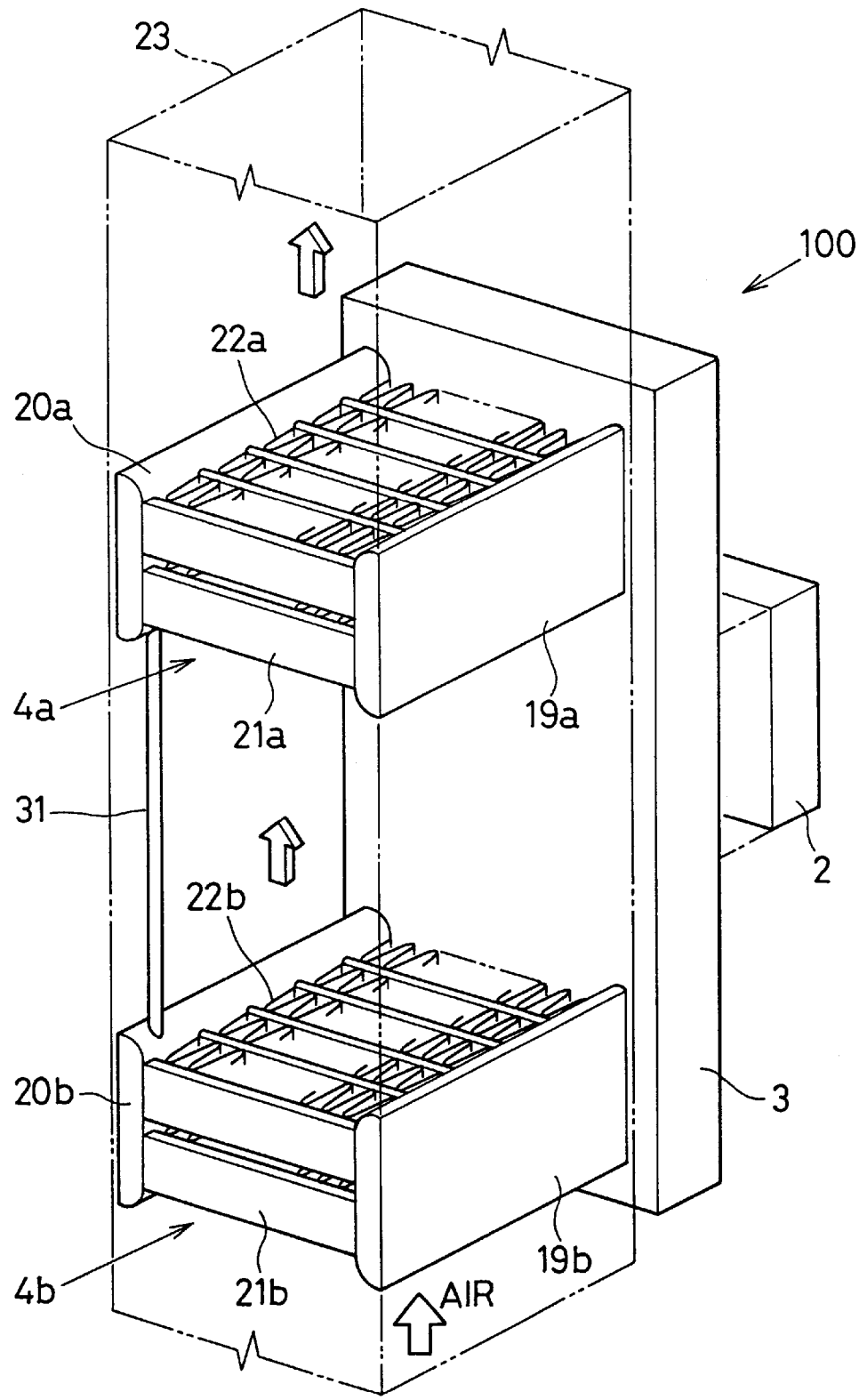
FIG. 9 is a perspective view of a cooling device according to a second preferred embodiment of the present invention.

The first radiator 4a is disposed at an upper side of the refrigerant tank 3 in FIG. 9 above from the refrigerant liquid surface within the refrigerant tank 3, and the second radiator 4b is disposed at a lower side of the refrigerant tank in FIG. 9. The first and second radiators 4a, 4b communicate with each other through a connection pipe 31, and have the same shape. In the second embodiment of the present invention, when the first and second radiators 4a, 4b are disposed as shown in FIG. 9 relative to the refrigerant tank 3, or when the cooling device 100 of FIG. 9 is vertically reversed (up-down reversed) so that the second radiator 4b is at the upper side relative to the refrigerant tank 3, the first and second radiators 4a, 4b cool and condense gas refrigerant boiled by heat from the heat-generating member 2 in the boiling space 7. Thus, even when the cooling device 100 is used in a normal state or in a reversed state, sufficient cooling performance can be maintained.

The first radiator 4a includes a pair of the first and second headers 19a, 20a, plural first radiator tubes 21a disposed between the first and second headers 19a, 20a to communicate with the first and second headers 19a, 20a, and plural first radiator fins 22a each of which is disposed between adjacent first radiator tubes 21a.

The first header 19a of the first radiator 4a is inserted into the first header connection portion 8a of the refrigerant tank 3 on the upper right side to communicate with the boiling space 7 of the refrigerant tank 3. The first header 19a is connected to the refrigerant tank 3 approximately vertically relative to the refrigerant tank 3.

On the other hand, the second header 20a of the first radiator 4a is inserted into the first header connection portion 9a of the refrigerant tank 3 on the upper left side. The second header 20a of the first radiator 4a is connected to the refrigerant tank 3 approximately vertically relative to the refrigerant tank 3 in parallel with the first header 19a.

The second radiator 4b includes a pair of the first and second headers 19b, 20b, plural second radiator tubes 21b disposed between the first and second headers 19b, 20b to communicate with the first and second headers 19b, 20b, and plural second radiator fins 22b each of which is disposed between adjacent second radiator tubes 21b.

The first header 19b of the second radiator 4b is inserted into the second header connection portion 8b of the refrigerant tank 3 on the lower right side to communicate with the boiling space 7 of the refrigerant tank 3. The first header 19b is connected to the refrigerant tank 3 approximately vertically relative to the refrigerant tank 3.

On the other hand, the second header 20b of the second radiator 4b is inserted into the second header connection portion 9b of the refrigerant tank 3 on the lower left side. The second header 20b is connected to the refrigerant tank 3 approximately vertically relative to the refrigerant tank 3 in parallel with the first header 19b of the second radiator 4b.

Each of the first and second radiator tubes 21a, 21b is formed into a flat shape which is thin in a laminating direction relative to a width of outer surfaces contacting the radiator fins 22a, 22b. Each of the first and second radiator fins 22a, 22b is formed into a wave shape by bending a thin plate such as an aluminum plate having a sufficient heat-transmitting performance, and is thermally bonded to adjacent outer wall surfaces of the first and second radiator tubes 21a, 21b.

Air is blown toward the first and second radiators 4a, 4b through an air passage defined by a duct 23. The duct 23 is disposed to enclose the first and second headers 19a, 20a of the first header 4a and the first and second headers 19b, 20b of the second header 4b. In FIG. 9, outside fluid (e.g., cool air) firstly flows upwardly through the second radiator 4b from below, and then flows upwardly through the first radiator 4a from below, through the air passage of the duct 23.

Next, operation of the cooling device 100 according to the second embodiment of the present invention will be now described. FIG. 9 shows a normal state of the cooling device 100, where the first radiator 4a is disposed at an upper side of the second radiator 4b relative to the radiator 3. In the normal state, liquid refrigerant is boiled in the boiling space 7 by heat from the heat-generating member 2, boiled gas refrigerant flows into the first radiator 4a from the boiling space 7, and passes through the first radiator 4a, as shown by arrow "a" in FIG. 11. That is, gas refrigerant from the boiling space 7 flows into the first header 19a, passes through the first radiator tubes 21a and flows into the second header 20a, while being cooled and condensed by cool air passing through the first radiator 4a.

Refrigerant cooled and condensed in the first radiator 4a flows toward the second radiator 4b through the connection pipe 31. As shown by arrow "b" in FIG. 11, in the second radiator 4b, refrigerant flows through the second radiator tubes 21b from the second header 20b toward the first header 19b while being further cooled and condensed therein, and thereafter returns into the boiling space 7 from the first header 19b of the second radiator 4b. In the second radiator 4b, because liquid refrigerant flows in a low speed, it is possible to cool refrigerant approximately until a temperature of cool air.

In a reversed state of the cooling device 100, the cooling device 100 is vertically reversed so that the first radiator 4a is disposed at a lower side of the second radiator 4b relative to the refrigerant tank 3. In the reversed state of the cooling device 100, liquid refrigerant within the refrigerant tank 3 is boiled by heat from the heat-generating member 2, and boiled gas refrigerant flows into the second radiator 4b from the boiling space 7. In the second radiator 4b, refrigerant flows through the second radiator tubes 21b from the first header 19b toward the second header 20b to be cooled and condensed by cool air. Partially condensed refrigerant from the second radiator 4b flows into the first radiator 4a through the connection pipe 31. In the first radiator 4a, refrigerant passes through the first radiator tubes 21a from the second header 20a toward the first header 19a to be further cooled, and thereafter flows into the boiling space 7. In the reversed state of the cooling device 100, because liquid refrigerant slowly flows through the first radiator 4a, refrigerant can be cooled approximately until the temperature of cool air.

According to the second embodiment of the present invention, the first and second radiators 4a, 4b are disposed at upper and lower both sides of the refrigerant tank 3.

Therefore, in the normal state of the cooling device 100, the first radiator 4a is positioned at an upper side of the refrigerant tank 3. On the other hand, in the reversed state of the cooling device 100, the second radiator 4b is positioned at the upper side of the refrigerant tank 3. Thus, even when the cooling device 100 is used in the normal state or the reversed state, any one of the first and second radiators 4a, 4b is positioned at the upper side of the refrigerant tank 3, and the other one thereof is positioned at the lower side of the refrigerant tank 3. As a result, in the normal state or the reversed state of the cooling device 100, the cooling device 100 has sufficient cooling performance, and effectively cools the heat-generating member 2.

Further, because the first radiator 4a and the second radiator 4b communicate with each other through the connection pipe 31, it is possible to cool refrigerant with both the first and second radiators 4a, 4b. Therefore, the radiating performance of the cooling device 100 can be further improved as compared with a single radiator disposed at an upper side of the refrigerant tank 3. If the first radiator 4a and the second radiator 4b do not communicate from each other through the connection pipe 31, a lower side radiator hardly cools refrigerant. According to the second embodiment of the present invention, even in this case where the size of a radiating portion is restricted, a sufficient radiating performance can be obtained in the cooling device 100.

Figure 12:
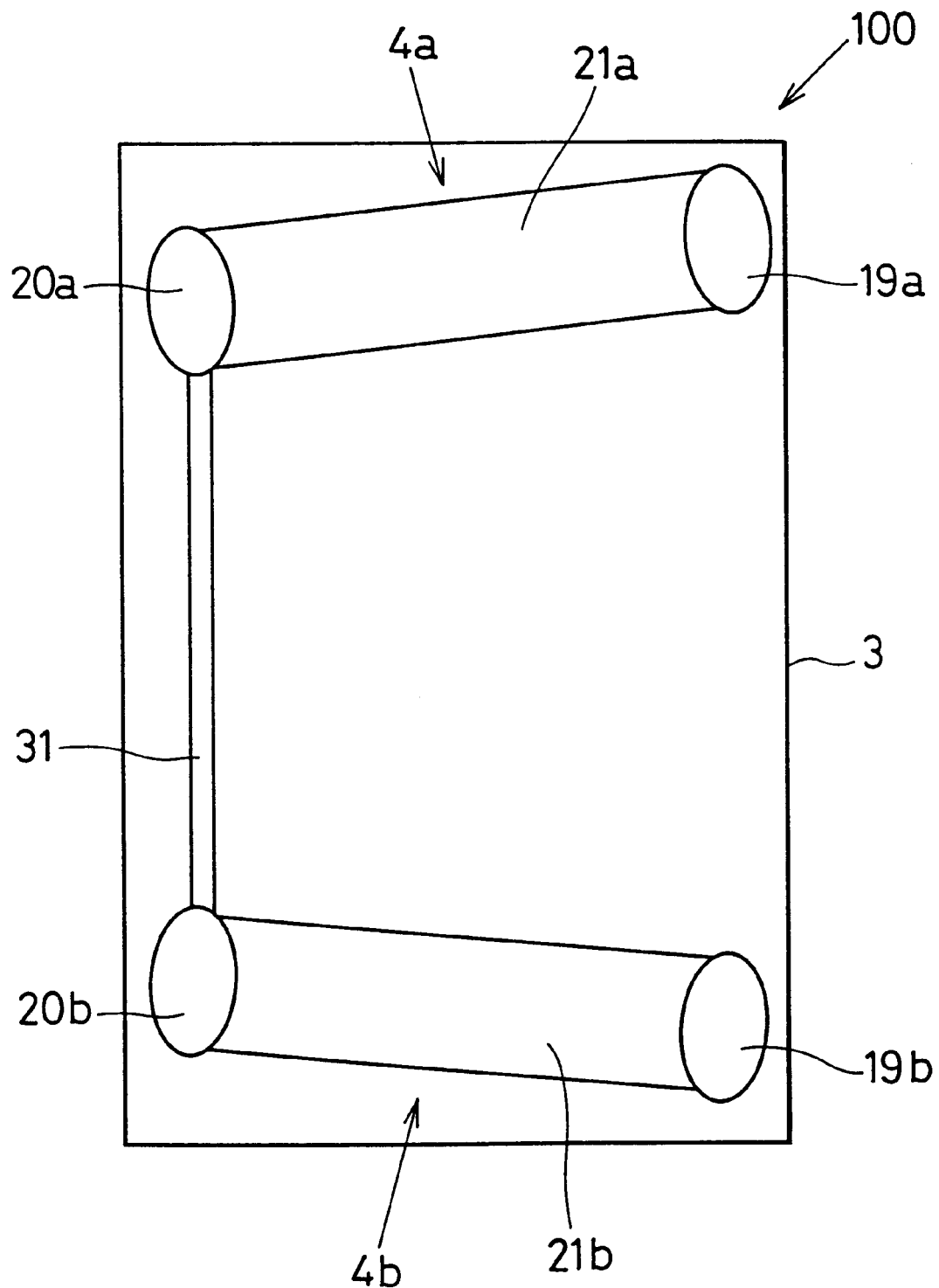
FIG. 12 is a schematic front view of a cooling device according to a third preferred embodiment of the present invention.

A third preferred embodiment of the present invention will be described with reference to FIG. 12. FIG. 12 is a front view of a cooling device 100 in a normal state according to the third embodiment. In the third embodiment, the first radiator 4a and the second radiator 4b are connected to the refrigerant tank 3 to be inclined relative to a horizontal direction, so that condensed liquid refrigerant readily flows toward the connection pipe 31 from the first radiator 4a and readily flows toward the refrigerant tank 3 from the second radiator 4b in the normal state. Even in the reversed state of the cooling device 100, condensed liquid refrigerant readily flows toward the connection pipe 31 from the second radiator 4b and readily flows toward the refrigerant tank 3 from the first radiator 4a.

As shown in FIG. 12, in the first radiator 4a, the second header 20a is disposed at a position lower than the first header 19a so that the first radiator tubes 21a are inclined downwardly from the first header 19a toward the second header 20a. Similarly, in the second radiator 4b, the first header 19b is disposed at a position lower than the second header 20b so that the second radiator tubes 21b is inclined downwardly from the second header 20b toward the first header 19b.

Thus, in the normal state of the cooling device 100, liquid refrigerant condensed in the first radiator 4a readily flows through the first radiator tubes 21a toward the second header 20a, and readily flows into the connection pipe 31 from the second header 20a of the first radiator 4a. On the other hand, even in the reversed state of the cooling device 100, because the second header 20b of the second radiator 4b is positioned at a lower side of the first header 19b of the second radiator 4b, condensed liquid refrigerant readily flows through the second radiator tubes 21b toward the second header 20b, and readily flows into the connection pipe 31 from the second header 20b of the second radiator 4b. In the third embodiment, the other portions are similar to those in the second embodiment of the present invention.

Figure 13A:
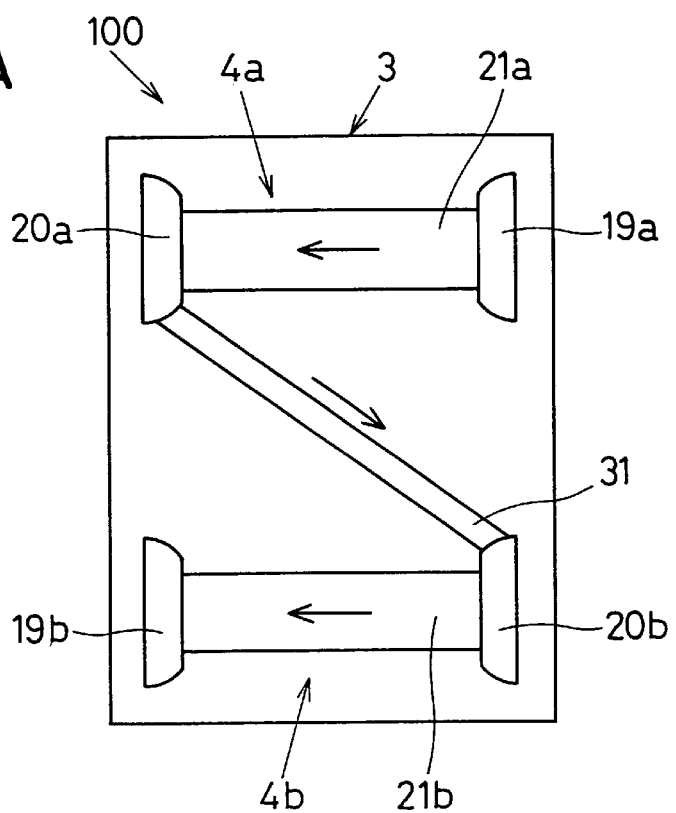
FIG. 13A is a schematic front view of a cooling device according to a fourth preferred embodiment of the present invention.
Figure 13B:
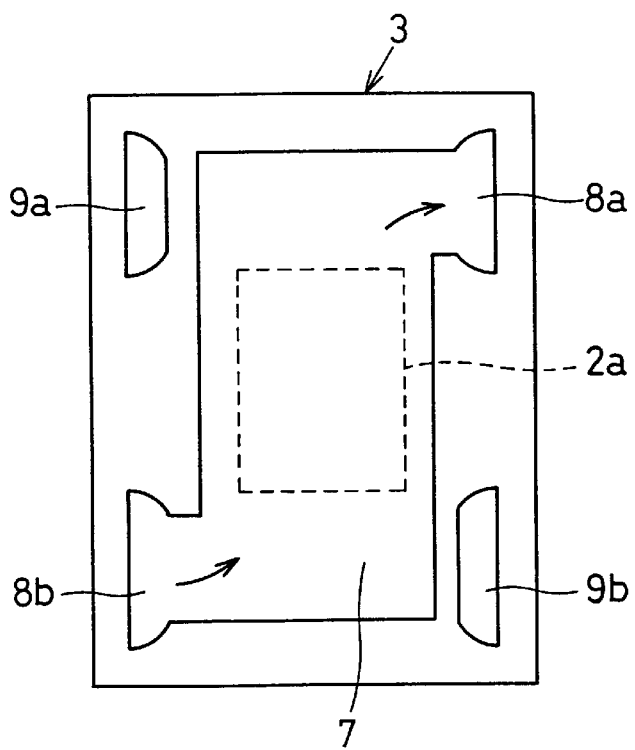
FIG. 13B is a plan view showing an inner structure of a refrigerant tank according to the fourth embodiment.

A fourth preferred embodiment of the present invention will be described with reference to FIGS. 13A, 13B. FIG. 13A is a front view of a cooling device 100 according to the fourth embodiment, and FIG. 13A is a plan view of the refrigerant tank 3. In the fourth embodiment, the first and second headers 19b, 20b of the second radiator 4b are connected to the refrigerant tank 3 left-right reversely, as compared with the above-described second embodiment. That is, as shown in FIG. 13A, the first header 19b of the second radiator 4b is disposed at the lower left side in the refrigerant tank 3 under the second header 20a of the first radiator 4a, and the second header 20b of the second radiator 4b is disposed at the lower right side in the refrigerant tank 3 under the first header 19a of the first radiator 4a.

Therefore, the second header 20a of the first radiator 4a is connected to the second header 20b of the second radiator 4b through a slanted connection pipe 31. Thus, the second header connection portions 8b, 9b are left-right reversely provided in the refrigerant tank 3, as compared with the above-described second embodiment of the present invention. In the fourth embodiment, the other portions are similar to those in the above-described second embodiment, and the effect similar to that of the second embodiment can be proposed.

Figure 14:
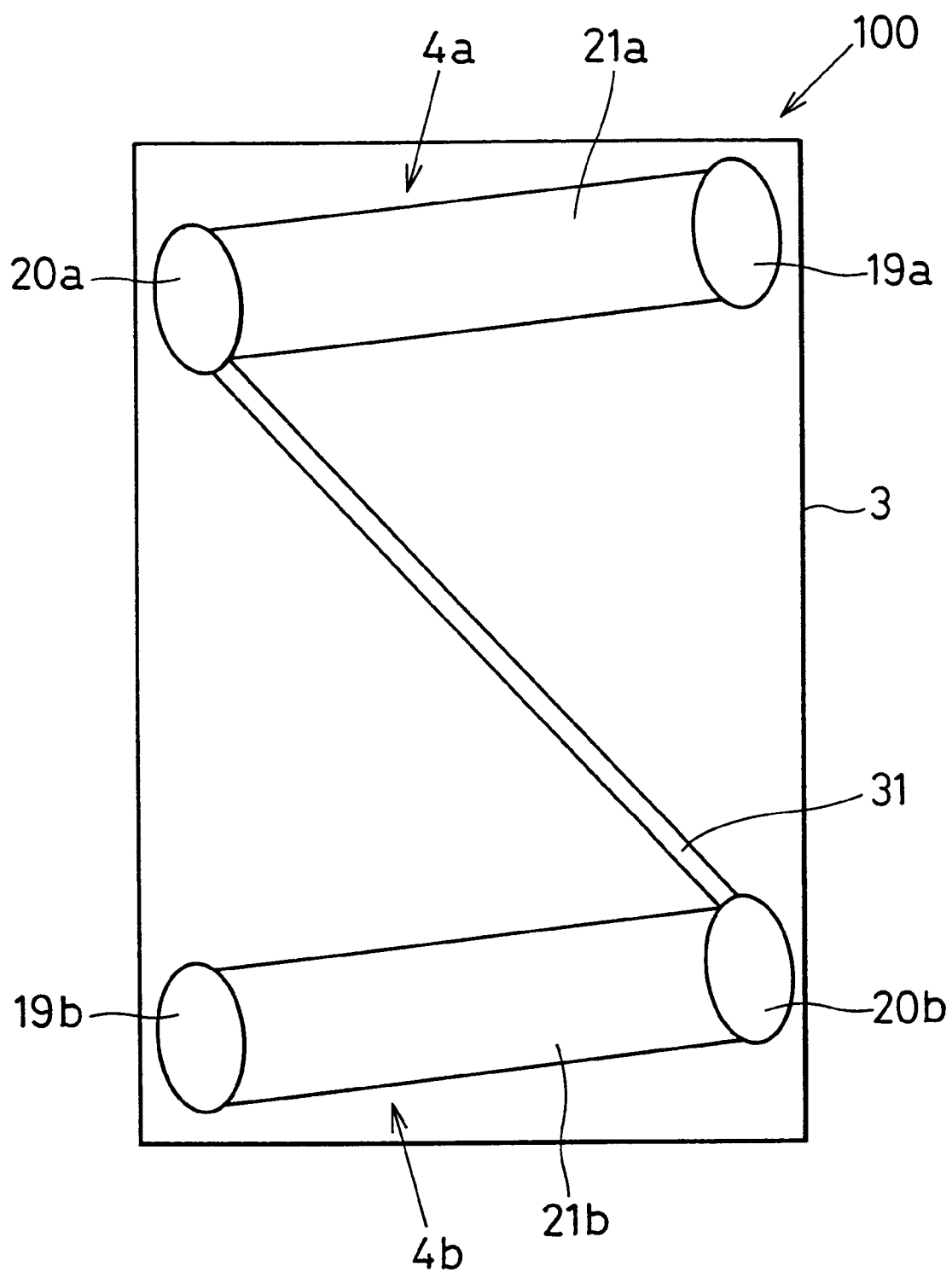
FIG. 14 is a schematic front view of a cooling device according to a fifth preferred embodiment of the present invention.

A fifth preferred embodiment of the present invention will be described with reference to FIG. 14. As shown in FIG. 14, in the fifth embodiment, the connection pipe 31 is connected between the second header 20a of the first radiator 4a and the second header 20b of the second radiator 4b, similarly to the above-described fourth embodiment. Further, the first and second radiators 4a, 4b are disposed to be inclined relative to the horizontal direction so that condensed liquid refrigerant readily flows into the connection pipe 31 in the first radiator 4a or the second radiator 4b. That is, in the normal state of the cooling device 100, condensed refrigerant readily flows through the first radiator tubes 21a, and readily flows into the connection pipe 31 from the second header 20a of the first radiator 4a. On the other hand, in the reversed state of the cooling device 100, condensed liquid refrigerant readily flows through the second radiator tubes 21b, and readily flows into the connection pipe 31 from the second header 20b of the second radiator 4b.

Figure 15A:
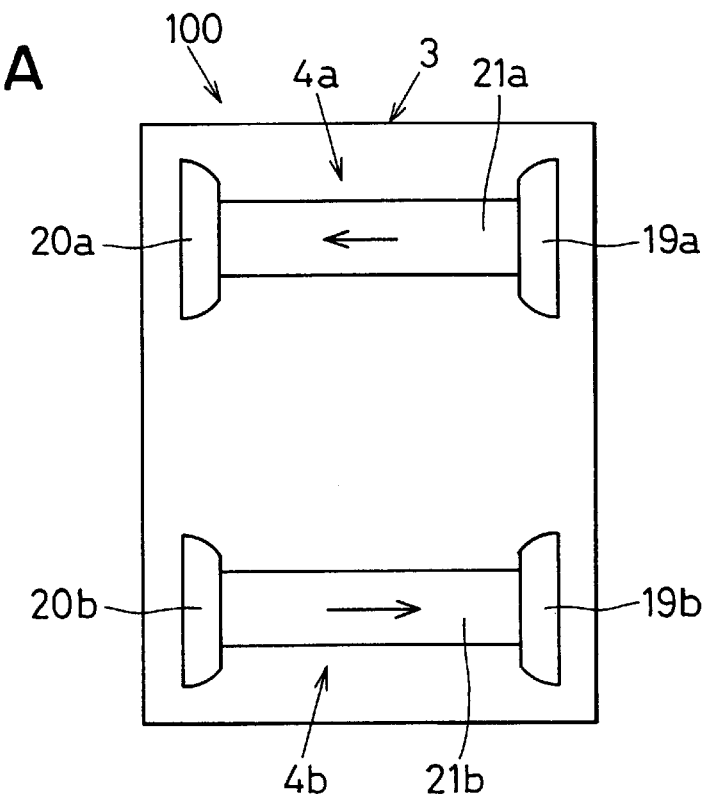
FIG. 15A is a schematic front view of a cooling device according to a sixth preferred embodiment of the present invention.
Figure 15B:
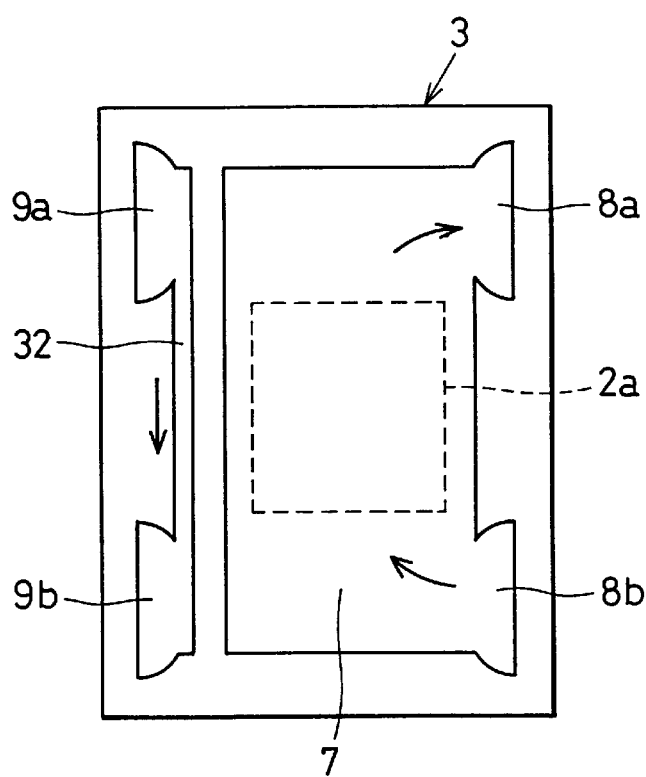
FIG. 15B is a plan view showing an inner structure of a refrigerant tank according to the sixth embodiment.
Figure 16:
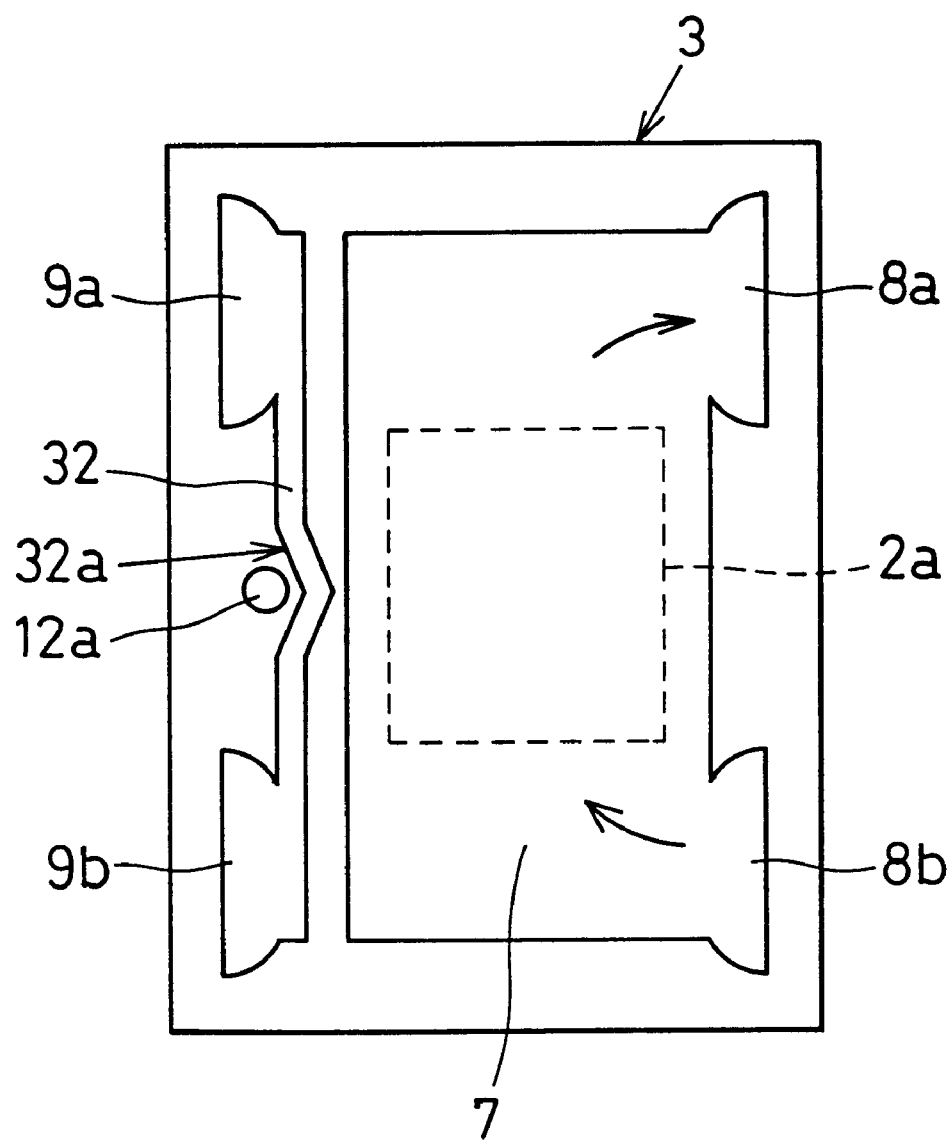
FIG. 16 is a plan view showing an inner structure of a refrigerant tank according to a modification of the sixth embodiment.

A sixth preferred embodiment of the present invention will be now described with reference to FIGS. 15A, 15B, 16. FIG. 15A is a front view of a cooling device 100 according to the sixth embodiment, and FIG. 15B is a plan view showing an inner structure of a refrigerant tank 3. In the sixth embodiment, a communication passage 32 through which the second header 20a of the first radiator 4a and the second header 20b of the second radiator 4b communicate with each other is provided in the refrigerant tank 3. Therefore, a connection pipe connecting the first and second radiator 4a, 4b is not provided outside the refrigerant tank 3, as shown in FIG. 15A.

As shown in FIG. 15B, the communication passage 32 is provided in the refrigerant tank 3 so that the first header connection portion 9a and the second header connection portion 9b of the refrigerant tank 3 communicate with each other. Thus, the second header 20a of the first radiator 4a connected to the first header connection portion 9a and the second header 20b of the second radiator 4b connected to the second header connection portion 9b communicate with each other through the communication passage 32. Thus, in the sixth embodiment, the effect similar to that of the second embodiment can be proposed.

Further, in the sixth embodiment, the communication passage 32 provided in the refrigerant tank 3 may be bent to have a bent portion 32a, and a hole 12a may be provided in the refrigerant tank 3 similarly to the above-described first embodiment. Therefore, an effect similar to that of the first embodiment can be obtained.

Figure 17A:
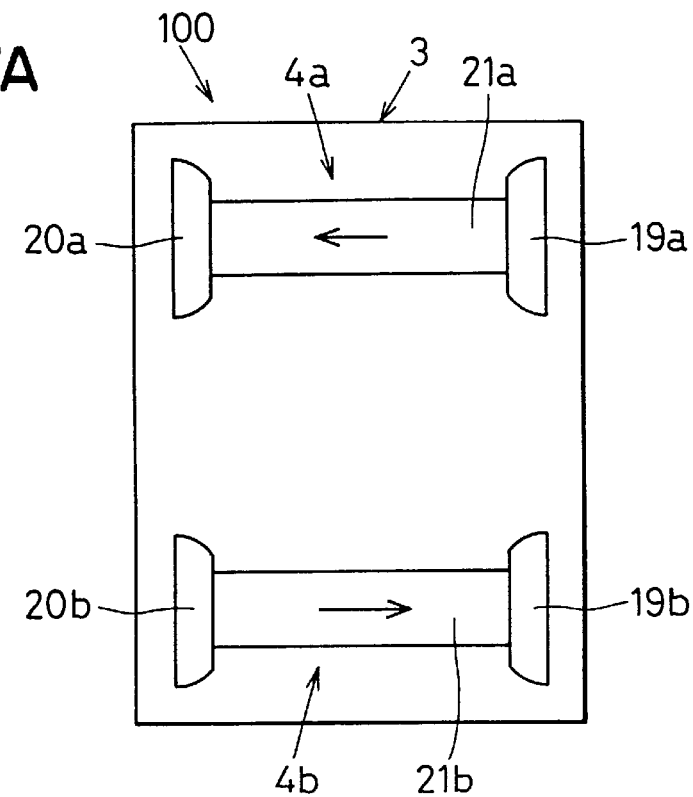
FIG. 17A is a schematic front view of a cooling device according to a seventh preferred embodiment of the present invention.
Figure 17B:
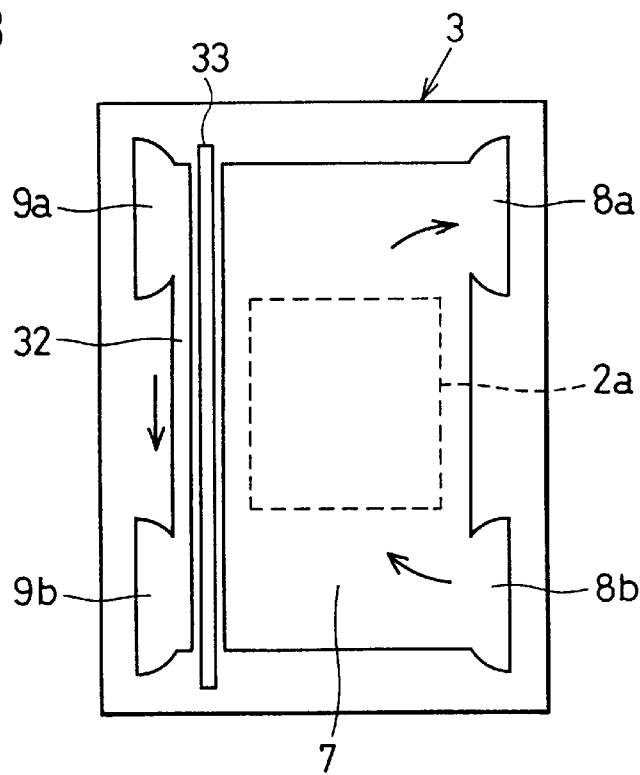
FIG. 17B is a plan view showing an inner structure of a refrigerant tank according to the seventh embodiment.

A seventh preferred embodiment of the present invention will be described with reference to FIGS. 17A, 17B. FIG. 17A is a front view of a cooling device 100 according to the seventh embodiment, and FIG. 17B is a plan view of a refrigerant tank 3 of the seventh embodiment. Similarly to the sixth embodiment of the present invention, the communication passage 32 for communicating the second header 20a of the first radiator 4a and the second header 20b of the second radiator 4b is provided in the refrigerant tank 3. Further, in the seventh embodiment, a heat-insulating layer 33 is disposed in the refrigerant tank 3 between the communication passage 32 and the boiling space 7. As shown in FIG. 17A, a connection pipe for connecting the first and second radiators 4a, 4b is not provided outside the refrigerant tank 3.

The heat-insulating layer 33 is formed into a passage like. When the communication passage 32 is provided in the refrigerant tank 3, condensed liquid refrigerant flowing through the communication passage 32 may be re-boiled by heat from the boiling space 7, and refrigerant may reversely flow through the communication passage 32. In the seventh embodiment of the present invention, as shown in FIG. 17B, because the heat-insulating layer 33 is provided between the communication passage 32 and the boiling space 7, it can prevent liquid refrigerant from being re-boiled and reversely flowing through the communication passage 32. The heat-insulating layer 33 may be made of a material having a sufficient heat-insulating performance to have sufficient heat-insulating effect. When the insulating layer 33 is formed into a passage-like space, the passage-like space may communicate with outside air to be filled with air, or may be evacuated. Even in this case, the bent portion 32a described in the sixth embodiment may be provided in the communication passage 32, and the hole 12a may be provided in the space provided due to the bent portion 32a.

Figure 18:
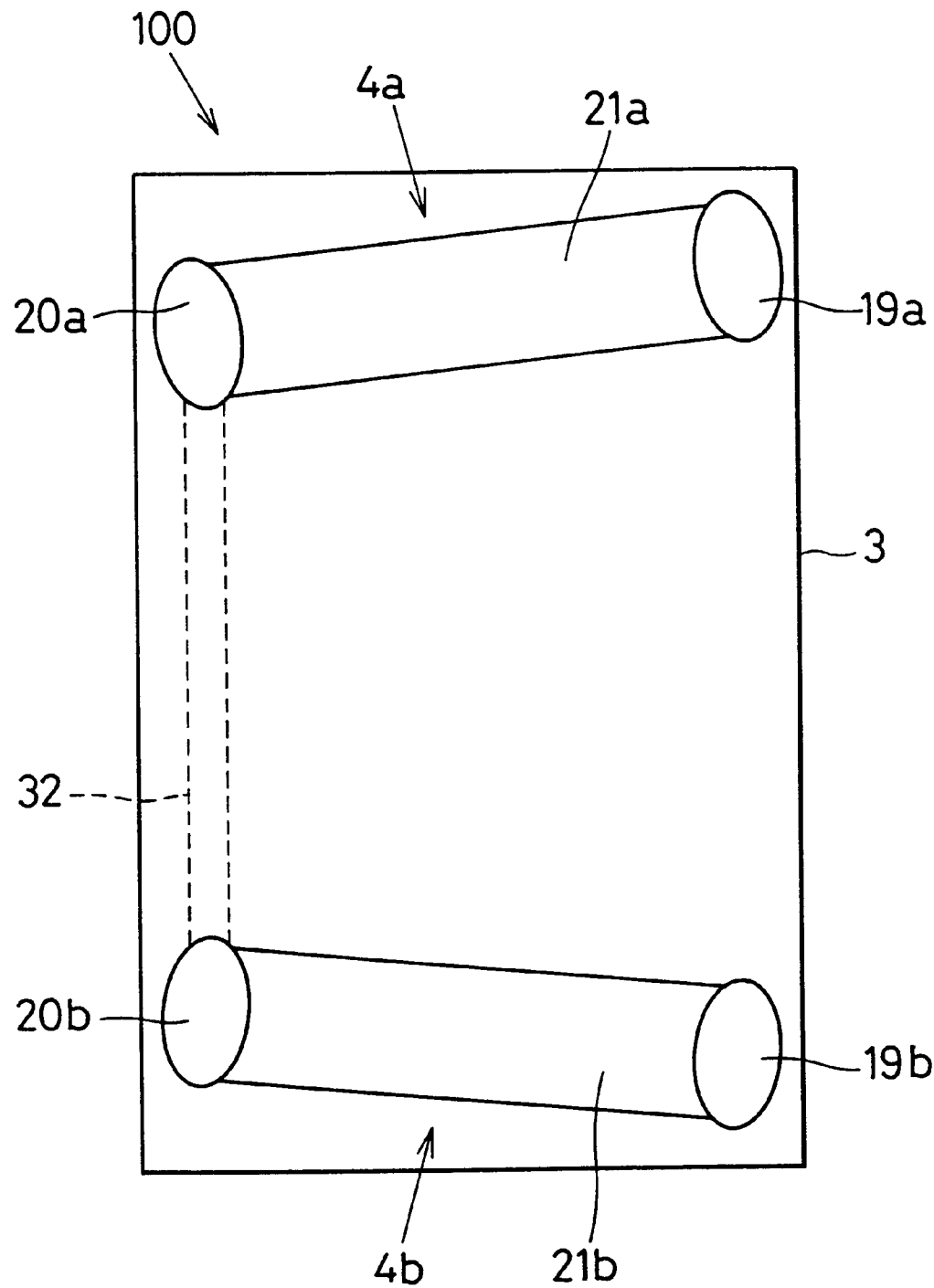
FIG. 18 is a schematic front view of a cooling device according to an eighth preferred embodiment of the present invention.

An eighth preferred embodiment of the present invention will be described with reference to FIG. 18. FIG. 18 is a front view of a cooling device 100 according to the eighth embodiment. Similarly to the above-described third and fifth embodiments, the first and second radiators 4a, 4b are inclined relative to the horizontal direction so that condensed liquid refrigerant readily flows from the first or second radiator 4a, 4b into the communication passage 32 provided in the refrigerant tank 3. Even when the cooling device 100 in FIG. 18 is vertically reversely disposed, liquid refrigerant readily flows from the first radiator 4a or the second radiator 4b into the communication passage 32.

Figure 19A:
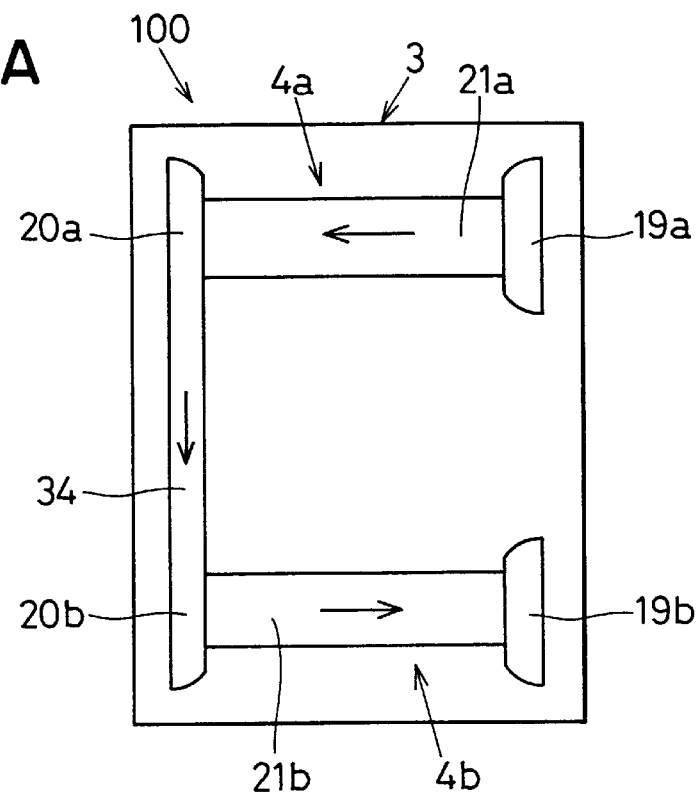
FIG. 19A is a schematic front view of a cooling device according to a ninth preferred embodiment of the present invention.
Figure 19B:
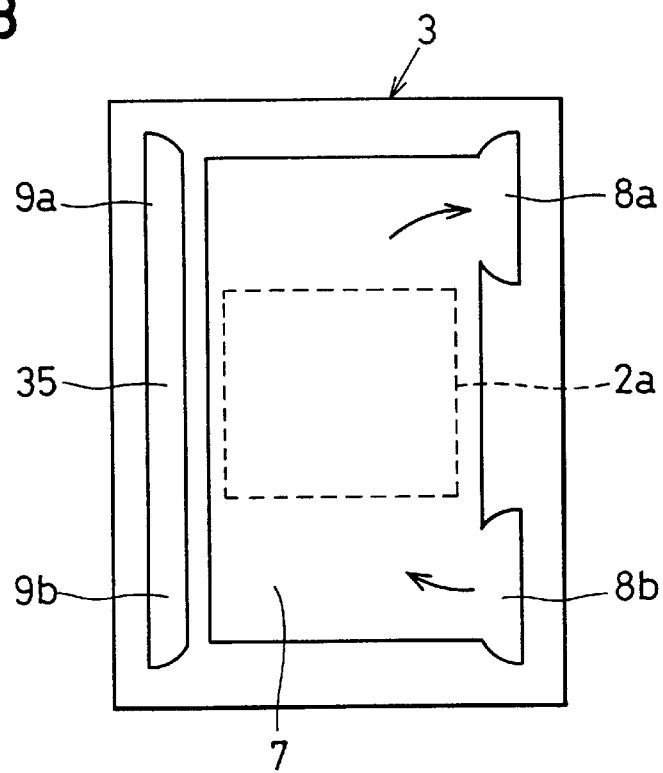
FIG. 19B is a plan view showing an inner structure of a refrigerant tank according to the ninth embodiment.

A ninth preferred embodiment of the present invention will be now described with reference to FIGS. 19A, 19B. FIG. 19A is a front view of a cooling device 100 according to the ninth embodiment, and FIG. 19B is a plan view of a refrigerant tank 3 showing a refrigerant flow. In the ninth embodiment, the second header 20a of the first radiator 4a and the second header 20b of the second radiator 4b are integrated to form a common header 34, as shown in FIG. 19A. Therefore, as shown in FIG. 19B, within the refrigerant tank 3, the first header connection portion 9a and the second header connection portion 9b are integrated to form a common header connection portion 35. The common header 34 is inserted into the common header connection portion 35. In the ninth embodiment of the present invention, refrigerant cooled in the first radiator 4a flows toward the second radiator 4b through the common header 35.

A tenth preferred embodiment of the present invention will be now described with reference to FIGS. 20A, 20B.

Figure 20A:
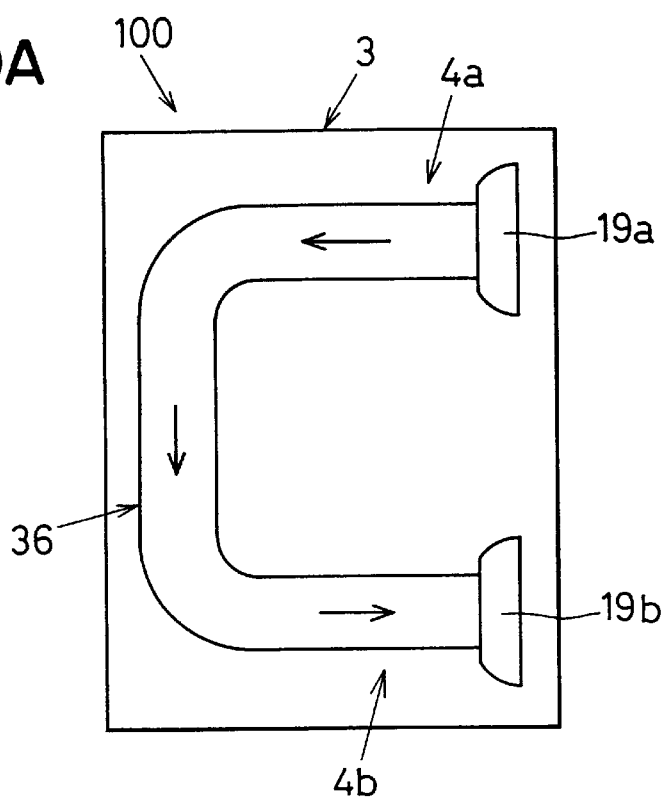
FIG. 20A is a schematic front view of a cooling device according to a tenth preferred embodiment of the present invention.
Figure 20B:
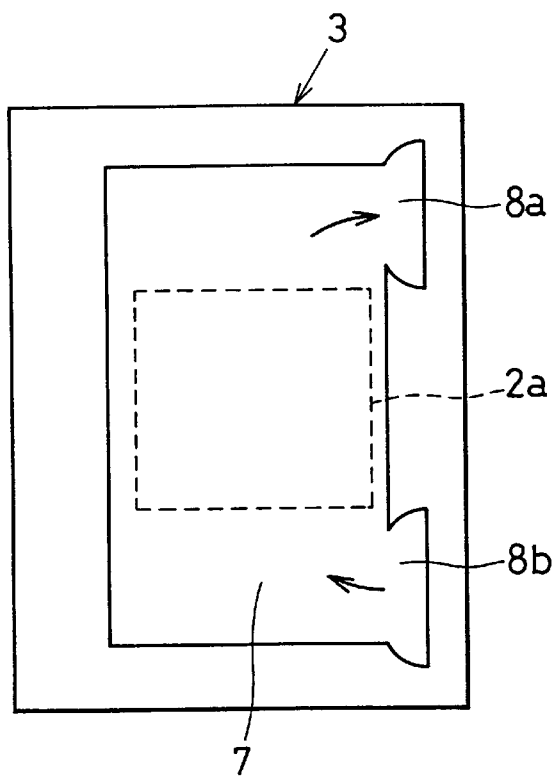
FIG. 20B is a plan view showing an inner structure of a refrigerant tank according to the tenth embodiment.

FIG. 20A is a front view of a cooling device 100 according to the tenth embodiment, and FIG. 20B is a plan view of a refrigerant tank 3 showing a refrigerant flow. In the tenth embodiment, the first radiator 4a and the second radiator 4b are integrally formed by a common radiating portion 36 bent into a U-shaped cross section. Therefore, as shown in FIG. 20A, it is not necessary to form the second header 20a in the first radiator 4a and to form the second header 20b in the second radiator 4b. Further, as shown in FIG. 20B, the first and second header connection portions 9a, 9b are not necessary in the refrigerant tank 3. Thus, gas refrigerant introduced into the first header 19a flows through the first radiator 4a, the common radiating portion 36 and the second radiator 4b. Thereafter, condensed liquid refrigerant flows into the boiling space 7 of the refrigerant tank 3 from the first header 19b of the second radiator 4b.

Figure 21:
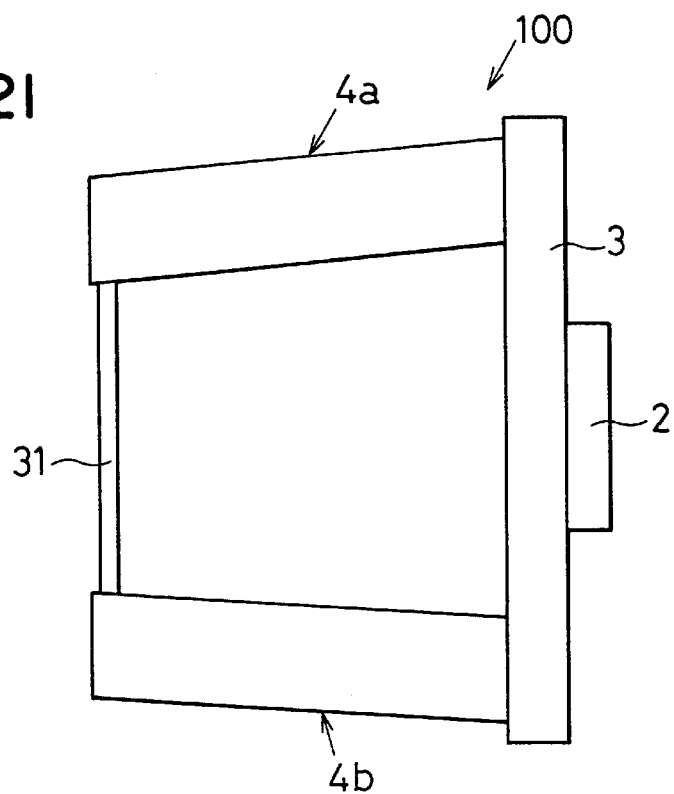
FIG. 21 is a side view of a cooling device according to an eleventh preferred embodiment of the present invention.

An eleventh preferred embodiment of the present invention will be now described with reference to FIG. 21. FIG. 21 is a side view of a cooling device 100 according to the eleventh embodiment. In the eleventh embodiment, during the normal state of the cooling device 100, the first radiator 4a is inclined downwardly from the refrigerant tank 3 toward the connection pipe 31, and the second radiator 4b is inclined downwardly from the connection pipe 31 toward the refrigerant tank 3. Therefore, the connection pipe 31 connects a most bottom end of the second header of the first radiator 4a and a most top end of the second header of the second radiator 4b. Thus, during the normal state or the reversed state of the cooling device 100, liquid refrigerant readily flows from the radiator 4a or the radiator 4b into the connection pipe 31.

Figure 22:
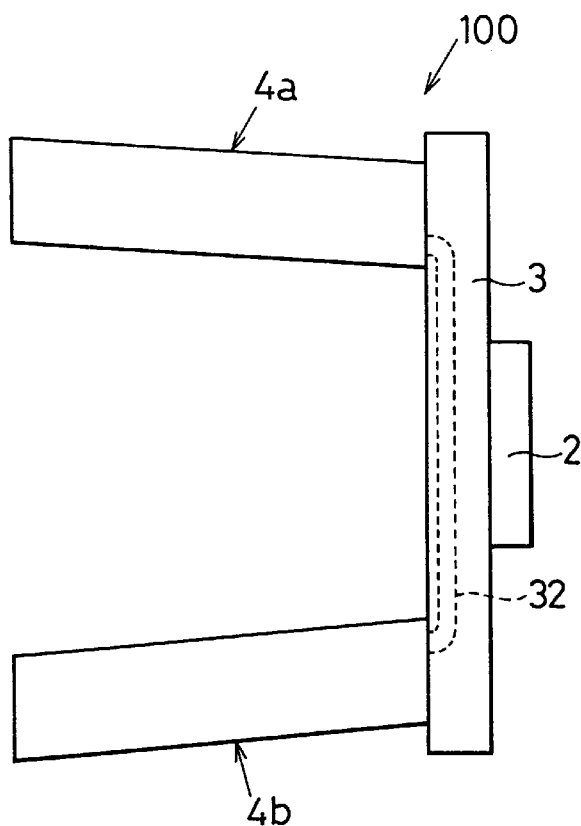
FIG. 22 is a side view of a cooling device according to a twelfth preferred embodiment of the present invention.

A twelfth preferred embodiment of the present invention will be now described with reference to FIG. 22. FIG. 22 is a side view of a cooling device 100 according to the twelfth embodiment. In the twelfth embodiment, a communication passage 32 through which the first radiator 4a and the second radiator 4b communicate with each other is provided within the refrigerant tank 3. Further, during the normal state of the cooling device 100, the first radiator 4a is inclined downwardly toward the communication passage 32 of the refrigerant tank 3, and the second radiator 4b is inclined upwardly toward the refrigerant tank 3. The second header of the first radiator 4a and the second header of the second radiator 4b communicate with each other through the communication passage 32. Thus, in the normal state or the reversed state of the cooling device 100, liquid refrigerant cooled and condensed in the first radiator 4a or the second radiator 4b readily flows into the communication passage 32.

Figure 23:
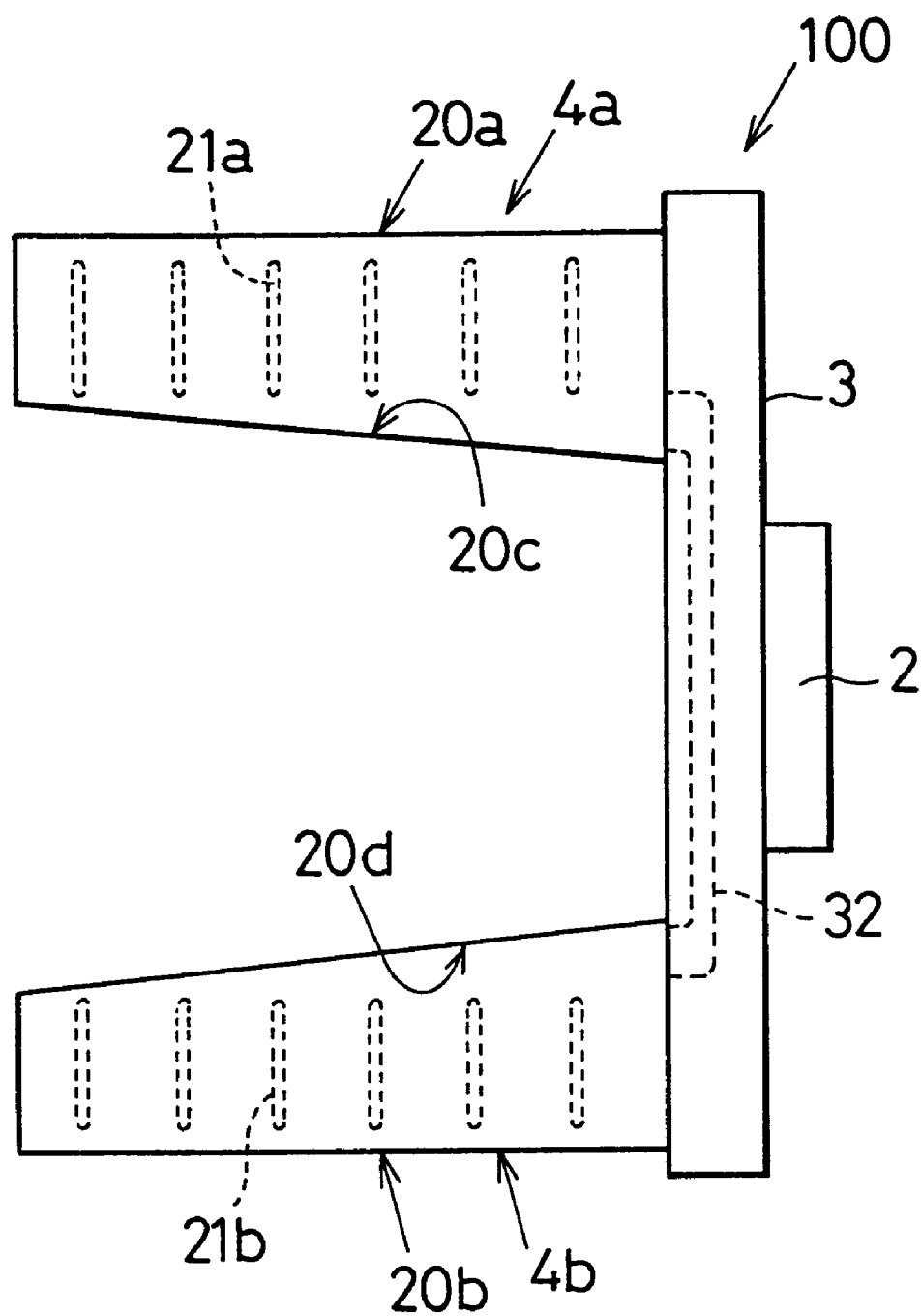
FIG. 23 is a side view of a cooling device according to a thirteenth preferred embodiment of the present invention.

A thirteenth preferred embodiment of the present invention will be now described with reference to FIG. 23. FIG. 23 is a side view of a cooling device 100 according to the thirteenth embodiment. As shown in FIG. 23, the communication passage 32 through which the first radiator 4a and the second radiator 4b communicate with each other is provided in the refrigerant tank 3. That is, the second header 20a of the first radiator 4a and the second header 20b of the second radiator 4b communicate with each other through the communication passage 32. Further, in the normal state, a bottom surface 20c of the second header 20a of the first radiator 4a is inclined downwardly toward the communication passage 32 of the refrigerant tank 3, and a top surface 20d of the second header 20b of the second radiator 4b is inclined upwardly toward the communication passage 32 of the refrigerant tank 3. Therefore, during the normal state of the cooling device 100, liquid refrigerant cooled and condensed in the first radiator 4a readily flows into the communication passage 32 through the second header 20a. On the other hand, during the reversed state of the cooling device 100, the top surface 20c of the second header 20b of the second radiator 4b becomes a bottom surface inclined downwardly toward the communication passage 32, and liquid refrigerant condensed and cooled in the second radiator 4b readily flows into the communication passage 32 along the inclined surface 20c.

Although the present invention has been fully described in connection with preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A cooling device boiling and condensing refrigerant, for cooling a heat-generating member, said cooling device comprising:

a refrigerant tank for containing liquid refrigerant, said refrigerant tank having a boiling space in which a part of liquid refrigerant is boiled and vaporized to gas refrigerant by absorbing heat from the heat-generating member; and first and second radiators for cooling and condensing gas refrigerant from said boiling space by performing heat exchange with outside fluid passing through said first and second radiators;

a communication passage separate from said refrigerant tank through which said first radiator and said second radiator communicate with each other; wherein:

said boiling space of said refrigerant tank has first and second space parts defined by a surface of the liquid refrigerant; and said first radiator is connected to said refrigerant tank to only communicate with said first space part of said boiling space, and said second radiator is connected to said refrigerant tank to only communicate with said second space part of said boiling space, among said first and second space parts.

2. The cooling device according to claim 1, wherein said first radiator is disposed at an upper side of said second radiator, so that liquid refrigerant condensed in said first radiator flows into said second radiator through said communication passage, and returns into said boiling space from said second radiator after being cooled in said second radiator.

3. The cooling device according to claim 1, wherein said communication passage is provided within said refrigerant tank.

4. The cooling device according to claim 3, wherein said communication passage has a bent portion bent to generate flow resistance.

5. The cooling device according to claim 1, wherein said communication passage is defined by a pipe which connects said first and second radiators outside said refrigerant tank.

6. The cooling device according to claim 2, wherein said first radiator is disposed to be inclined relative to a horizontal direction so that liquid refrigerant condensed in said first radiator is readily flows into said communication passage.

7. The cooling device according to claim 1, wherein:

said first and second radiators are disposed relative to said refrigerant tank to be used in a normal state where said first radiator is disposed at an upper side of said second radiator and in a reversed state where said first and second radiators and said refrigerant tank in the normal state are reversed in a vertical direction.

8. The cooling device according to claim 7, wherein said first and second radiators are disposed in such a manner that any one of said first and second radiators positioned at an upper side in the vertical direction is inclined relative to a horizontal direction to be readily introduce liquid refrigerant into said communication passage, during said normal state and said reversed state.

9. The cooling device according to claim 7, wherein, during said normal state, said communication passage is connected to said first radiator at a most bottom end and is connected to said second radiator at a most top end.

10. The cooling device according to claim 2, wherein:

said first radiator includes a first header into which gas refrigerant from said boiling space flows, a plurality of first tubes in which gas refrigerant from said first header is cooled and condensed by performing heat exchange with outside fluid passing through said first radiator, and a second header through which liquid refrigerant condensed in said first tubes is introduced into said communication passage; and said second header of said first radiator has a bottom surface inclined downwardly toward said communication passage.

11. The cooling device according to claim 2, wherein:

said first radiator includes a first header into which gas refrigerant from said boiling space flows, a plurality of first tubes in which gas refrigerant from said first header is cooled and condensed by performing heat exchange with outside fluid passing through said first radiator, and a second header through which liquid refrigerant condensed in said first tubes is introduced into said communication passage; and said second radiator includes a first header into which refrigerant from said communication passage flows, a plurality of second tubes in which refrigerant from said first header of said second radiator is further cooled and condensed by performing heat exchange with outside fluid passing through said second radiator, and a second header through which liquid refrigerant from said second tubes is introduced into said boiling space.

12. The cooling device according to claim 11, wherein said second header of said first radiator and said first header of said second radiator are integrated to form said communication passage.

13. The cooling device according to claim 11, wherein said communication passage is provided within said refrigerant tank.

14. The cooling device according to claim 11, wherein said first and second radiators are disposed relative to said refrigerant tank to be used in a normal state where said first radiator is disposed at an upper side of said second radiator and in a reversed state where said first and second radiators and said refrigerant tank in the normal state are reversed in a vertical direction.

15. The cooling device according to claim 1, wherein said first and second radiators are integrally formed.

16. The cooling device according to claim 1, wherein:

said refrigerant tank includes first and second wall surfaces disposed approximately vertically to be opposite to each other;

said boiling space is provided between said first and second wall surfaces of said refrigerant tank;

the heat-generating member is attached onto said first wall surface of said refrigerant tank; and said first and second radiators are disposed to be connected to said second wall surface of said refrigerant tank so that outside fluid passes through said first and second radiators vertically.

* * * * *